(12) United States Patent
Liaw

(10) Patent No.: US 12,400,713 B2
(45) Date of Patent: Aug. 26, 2025

(54) MEMORY CELL

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 427 days.

(21) Appl. No.: 18/167,437

(22) Filed: Feb. 10, 2023

(65) Prior Publication Data

US 2024/0087646 A1    Mar. 14, 2024

Related U.S. Application Data

(60) Provisional application No. 63/406,308, filed on Sep. 14, 2022.

(51) Int. Cl.
| | | |
|---|---|---|
| *G11C 15/04* | (2006.01) | |
| *G11C 7/18* | (2006.01) | |
| *H03K 19/017* | (2006.01) | |

(52) U.S. Cl.
CPC ............. *G11C 15/04* (2013.01); *G11C 7/18* (2013.01); *H03K 19/01742* (2013.01)

(58) Field of Classification Search
CPC .................................. G11C 15/04; G11C 7/18

USPC ....................................................... 365/49.17
See application file for complete search history.

(56) References Cited

U.S. PATENT DOCUMENTS

| | | | |
|---|---|---|---|
| 9,183,933 B2 | 11/2015 | Liaw | |
| 9,406,681 B2 | 8/2016 | Liaw | |
| 9,768,179 B1 | 9/2017 | Liaw | |
| 9,865,349 B2 | 1/2018 | Liaw | |
| 10,535,667 B1* | 1/2020 | Liaw | H10B 10/12 |
| 2005/0152199 A1* | 7/2005 | Park | G11C 15/043 |
| | | | 365/222 |
| 2023/0389260 A1* | 11/2023 | Liaw | G11C 11/413 |

* cited by examiner

*Primary Examiner* — Connie C Yoha
(74) *Attorney, Agent, or Firm* — Cooper Legal Group, LLC

(57) ABSTRACT

Memory cells are provided. A memory cell includes a first data storage cell, a second data storage cell and a match cell. The first data storage cell includes a first pull-down transistor, a first pull-up transistor and a first pass-gate transistor. The second data storage cell includes a second pull-down transistor, a second pull-up transistor, and a second pass-gate transistor. The match cell includes a first data transistor and a second data transistor. The first data transistor is electrically connected to the first pull-down transistor, the first pull-up transistor and the first pass-gate transistor. The second data transistor is electrically connected to the second pull-down transistor, the second pull-up transistor and the second pass-gate transistor. The first and second data storage cells and the match cell have the same cell height. The match cell is disposed between the first and second data storage cells.

20 Claims, 23 Drawing Sheets

MEMORY CELL

CROSS REFERENCE TO RELATED APPLICATIONS

This application claims priority to U.S. Provisional Application No. 63/406,308, filed on Sep. 14, 2022, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Content addressable memories (CAMs) are widely used in applications, for example, where extremely fast search on a database is required, such as in networking, imaging, voice recognition, etc. For example, in network engines, CAMs are used to perform a fast search of the database, corresponding to the header field of any packet, and forward the packet to the corresponding matched address.

Since a very fast search may be required, search performance may be a critical performance parameter for CAMs. Also, the basic mechanism of search may be very power intensive, owing to a parallel nature of operation. Hence, it can be extremely important for a TCAM (Ternary CAM) design to have the best possible search performance along with having the least dynamic power expenditure for the search.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1A:
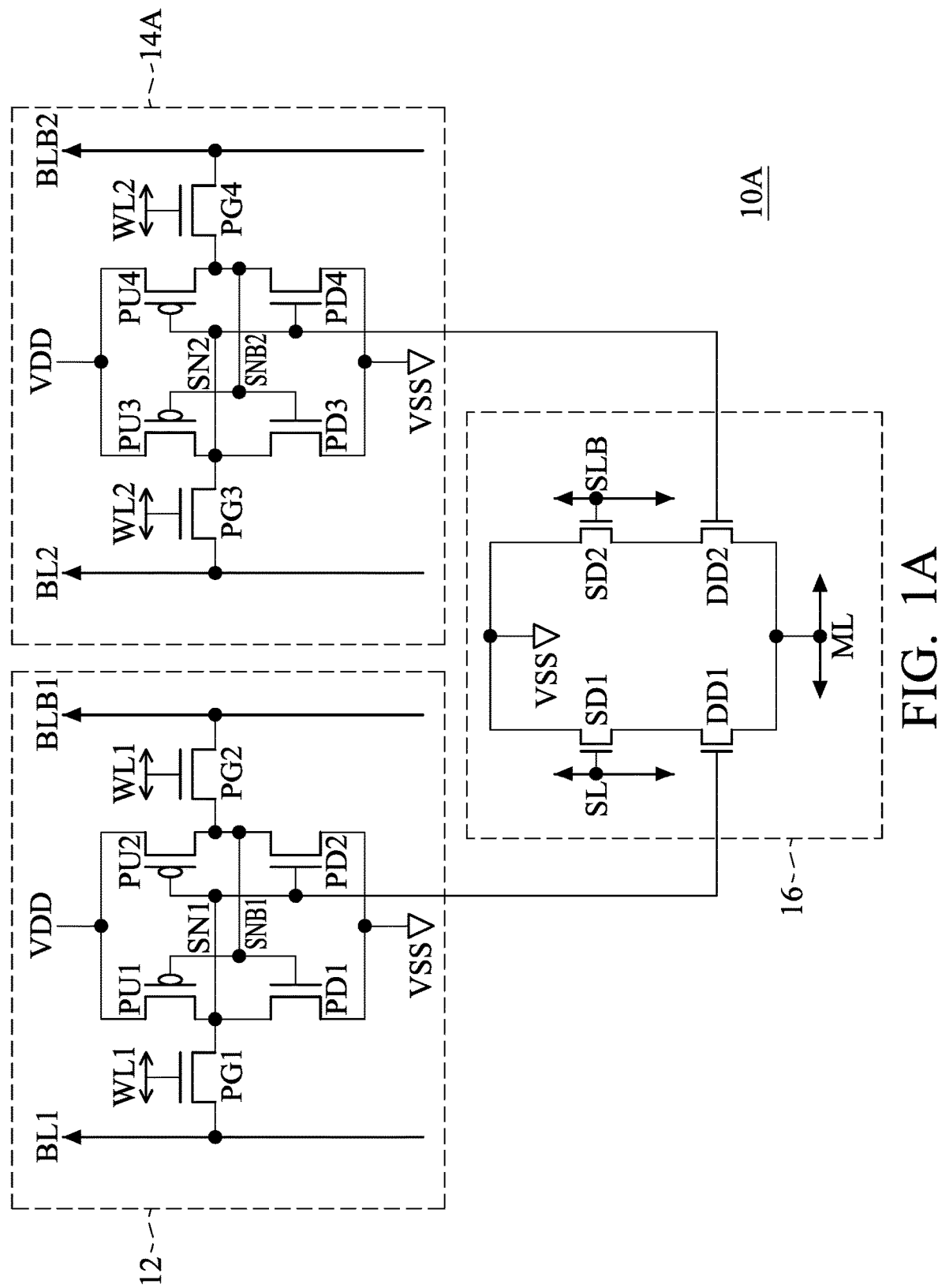
FIG. 1A shows a memory cell, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments disclosed herein will be described with respect to a specific context, namely a memory cell and array, and more particularly, a ternary content addressable memory (TCAM) cell and array. Various modifications are discussed with respect to embodiments; however, other modifications may be made to disclose embodiments while remaining within the scope of the subject matter. A person of ordinary skill in the art will readily understand modifications that may be made.

FIG. 1A shows a memory cell 10A, in accordance with some embodiments of the disclosure. The memory cell 10A is a TCAM cell, and includes a first data storage cell 12, a second data storage cell 14A, and a match cell 16.

The first data storage cell 12 includes the pull-up transistors PU1 and PU2, the pull-down transistors PD1 and PD2, and the pass-gate transistors PG1 and PG2. The drains of the pull-up transistor PU1 and the pull-down transistor PD1 are coupled together, and the drains of the pull-up transistor PU2 and the pull-down transistor PD2 are coupled together, the pull-up transistor PU1 and the pull-down transistor PD1 are cross-coupled with the pull-up transistor PU2 and the pull-down transistor PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a first complementary storage node SNB1. The sources of the pull-up transistors PU1 and PU2 are coupled to a power voltage VDD, and the sources of the pull-down transistors PD1 and PD2 are coupled to a ground voltage VSS.

The first storage node SN1 of the first data latch is coupled to a first bit line BL1 through the pass-gate transistor PG1, and the first complementary storage node SNB1 is coupled to a first complementary bit line BLB1 through the pass-gate transistor PG2. The first bit line BL1 and the first complementary bit line BLB1 is a first bit line pair. The first storage node SN1 and the first complementary storage node SNB1 are complementary nodes that are often at opposite logic levels (logic high or logic low). The gates of the pass-gate transistors PG1 and PG2 are coupled to a first word line WL1.

The second data storage cell 14A includes the pull-up transistors PU3 and PU4, the pull-down transistors PD3 and PD4, and the pass-gate transistors PG3 and PG4. The drains of the pull-up transistor PU3 and the pull-down transistor PD3 are coupled together, and the drains of the pull-up transistor PU4 and the pull-down transistor PD4 are coupled together, the pull-up transistor PU3 and the pull-down transistor PD3 are cross-coupled with the pull-up transistor PU4 and the pull-down transistor PD4 to form a first data latch. The gates of transistors PU4 and PD4 are coupled together and to the drains of transistors PU3 and PD3 to form a second storage node SN2, and the gates of transistors PU3 and PD3 are coupled together and to the drains of transistors PU4 and PD4 to form a second complementary storage node SNB2. The sources of the pull-up transistors PU3 and PU4 are coupled to a power voltage VDD, and the sources of the pull-down transistors PD3 and PD4 are coupled to a ground voltage VSS.

The second storage node SN4 of the second data latch is coupled to a second bit line BL2 through the pass-gate transistor PG3, and the second complementary storage node SNB2 is coupled to a second complementary bit line BLB2 through the pass-gate transistor PG4. The second bit line BL2 and the second complementary bit line BLB2 is a second bit line pair that is different from the first bit line pair (i.e., BL1/BLB1). In other words, the second bit line BL2 and the second complementary bit line BLB2 are independent of the second bit line BL1 and the first complementary bit line BLB1. The second storage node SN2 and the second complementary storage node SNB2 are complementary nodes that are often at opposite logic levels (logic high or logic low). The gates of the pass-gate transistors PG3 and PG4 are coupled to a second word line WL2.

In the memory cell 10A, the first data storage cell 12 is a 6 transistors (6-T) SRAM cell accessed by the first word line WL1, the first bit line BL1 and the first complementary bit line BLB1. Furthermore, the second data storage cell 14A is also a 6-T SRAM cell accessed by the second word line WL2, the second bit line BL2 and the second complementary bit line BLB2. Compared with the traditional TCAM cell including two data storage cells acceded by the same bit line pair, the first data storage cell 12 and the second data storage cell 14A are accessed by the different bit line pair and the different word lines in the memory cell 10A.

The first and second data latches form a storage port SP of the memory cell 10A. The match cell 16 is cascaded from the storage port SP. The match cell 16 includes the search transistors SD1 and SD2, and the data transistors DD1 and DD2. A source of the search transistor SD1 is coupled to the ground VSS. A drain of the search transistor SD1 is coupled to a source of the data transistor DD1. A drain of the data transistor DD1 is coupled to a match line ML. In other words, the search transistor SD1 and the data transistor DD1 are cascade-coupled between the match line ML and the ground VSS. A gate of the search transistor SD1 is coupled to a search line SL, and a gate of the data transistor DD1 is coupled to the first storage node SN1. A source of the search transistor SD2 is coupled to the ground VSS. A drain of the search transistor SD2 is coupled to a source of the data transistor DD2. A drain of the data transistor DD2 is coupled to the match line ML. In other words, the search transistor SD2 and the data transistor DD2 are cascade-coupled between the match line ML and the ground VSS. A gate of the search transistor SD2 is coupled to a complementary search line SLB, and a gate of the data transistor DD2 is coupled to the second storage node SN2.

The pull-up transistors PU1, PU2, PU3 and PU4 are the P-type transistors. The pull-down transistors PD1, PD2, PD3 and PD4, the pass-gate transistors PG1, PG2, PG3 and PG4, the search transistors SD1 and SD2, and the data transistors DD1 and DD2 are the N-type transistors. The P-type transistors and the N-type transistors are formed by either FinFET transistor or vertically stacked gate-all-around (GAA) horizontal nanosheets transistors. The FinFET transistor may include single-fin or multiple fin. The GAA transistor may include single or multiple vertically stacked nano-sheet (or nano-wire, or fork-sheet).

In FIG. 1A, the memory cell 10A has two independent bit-line pairs (e.g., BL1/BLB1 and BL2/BLB2) and the word-lines (e.g., WL1 and WL2), the parallel data can be written into the first data storage cell 12 and the second data storage cell 14A.

Figure 1B:
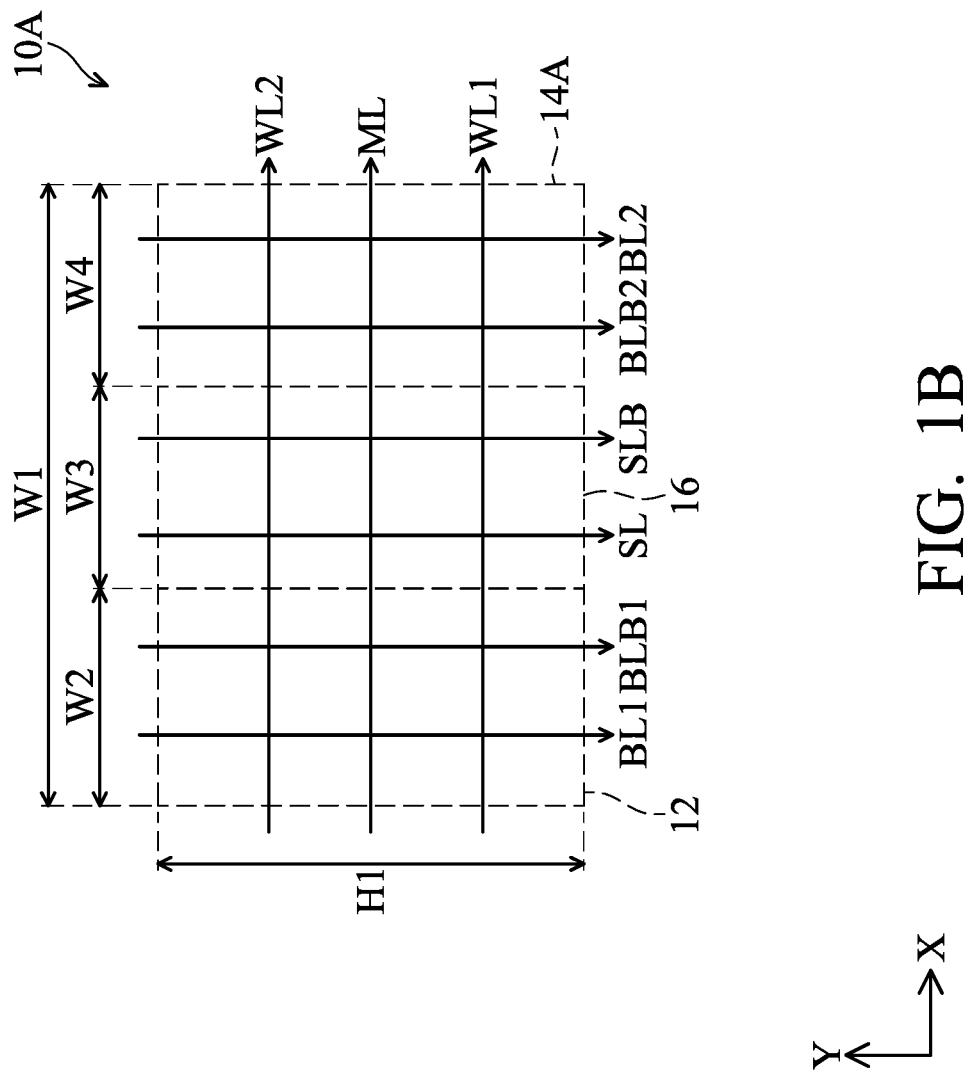
FIG. 1B shows an example illustrating the signal placement of the memory cell of FIG. 1A, in accordance with some embodiments of the disclosure.

FIG. 1B shows an example illustrating the signal placement of the memory cell 10A of FIG. 0.1A, in accordance with some embodiments of the disclosure. The memory cell 10A has a cell width W1 in the X-direction, and a cell height H1 in the Y-direction. The match cell 16 is disposed between the first data storage cell 12 and the second data storage cell 14A. In the memory cell 10A, the match cell 16, the first data storage cell 12 and the second data storage cell 14A have the same cell height H1. The match cell 16, the first data storage cell 12 and the second data storage cell 14A have the cell widths W2, W3 and W4, respectively. In some embodiments, the cell width W2 is equal to the cell width W4. In some embodiments, the cell widths W2 and W4 are greater than the cell width W3.

In FIG. 1B, the first word line WL1, the match line ML and the second word line WL2 extend in the X-direction and pass through the first data storage cells 12, the match cells 16, and the second data storage cells 14A of the memory cells 10A in the same row. The first bit line BL1 and the first complementary bit line BLB1 extend in the Y-direction and pass through the first data storage cells 12 of the memory cells 10A in the same column. The search line SL and the complementary search line SLB extend in the Y-direction and pass through the match cells 16 of the memory cells 10A in the same column. The second bit line BL2 and the second complementary bit line BLB2 extend in the Y-direction and pass through the second data storage cells 14A of the memory cells 10A in the same column.

Figure 2A:
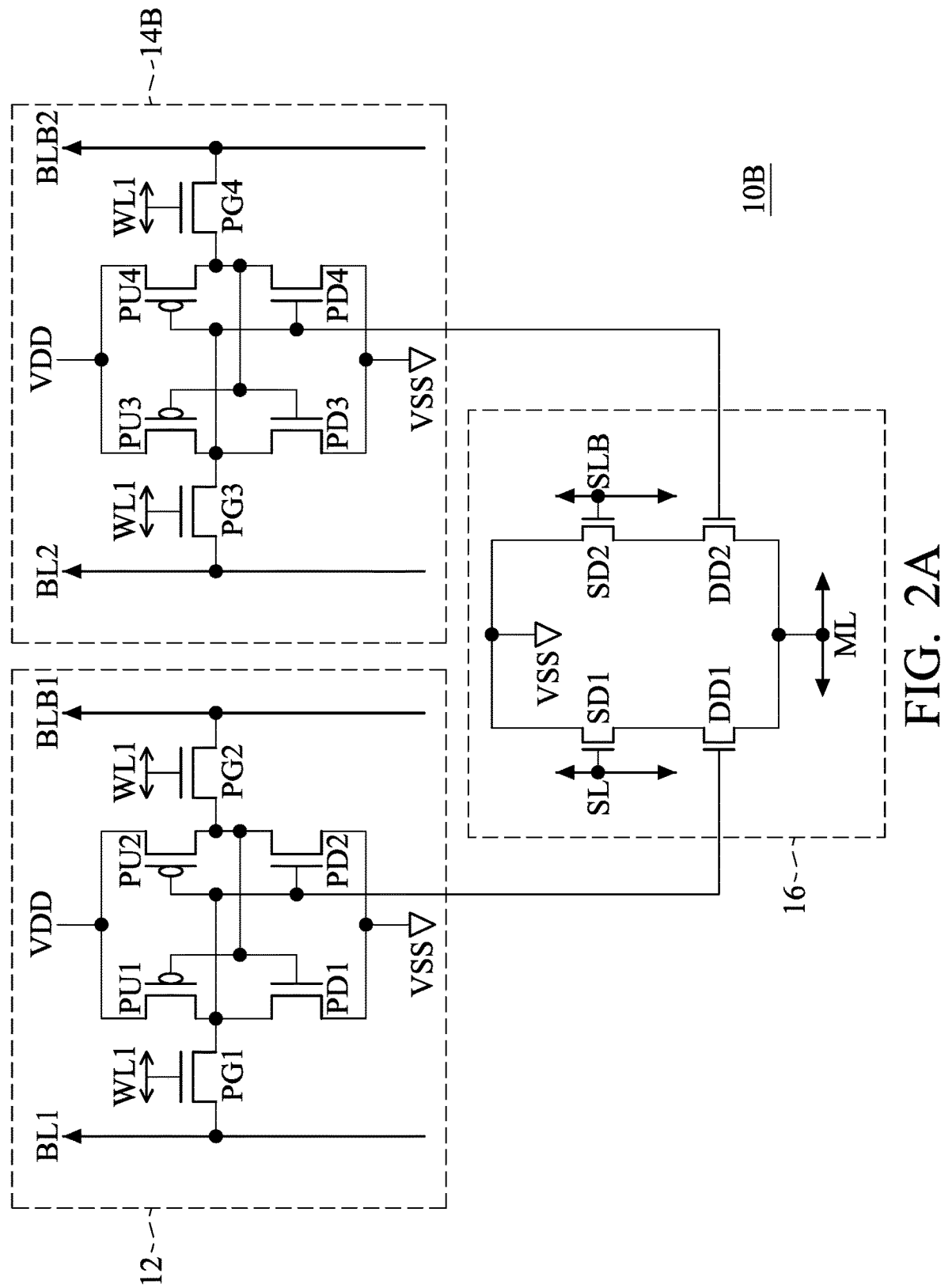
FIG. 2A shows a memory cell, in accordance with some embodiments of the disclosure.

FIG. 2A shows a memory cell 10B, in accordance with some embodiments of the disclosure. The memory cell 10B is a TCAM cell, and includes a first data storage cell 12, a second data storage cell 14B, and a match cell 16. The configuration of the memory cell 10B is similar to the configuration of the memory cell 10A in FIG. 1A, and the difference between the second data storage cell 14B of FIG. 2A and the second data storage cell 14A of FIG. 1A is that the gates of the pass-gate transistors PG3 and PG4 are coupled to a first word line WL1.

In the memory cell 10B, the first data storage cell 12 is a 6-T SRAM cell accessed by the first word line WL1, the first bit line BL1 and the first complementary bit line BLB1. Furthermore, the second data storage cell 14B is also a 6-T SRAM cell accessed by the first word line WL1, the second bit line BL2 and the second complementary bit line BLB2. Compared with the traditional TCAM cell including two data storage cells acceded by the same bit line pair, the first data storage cell 12 and the second data storage cell 14A are accessed by the different bit line pair and the same word line in the memory cell 10B.

Figure 2C:
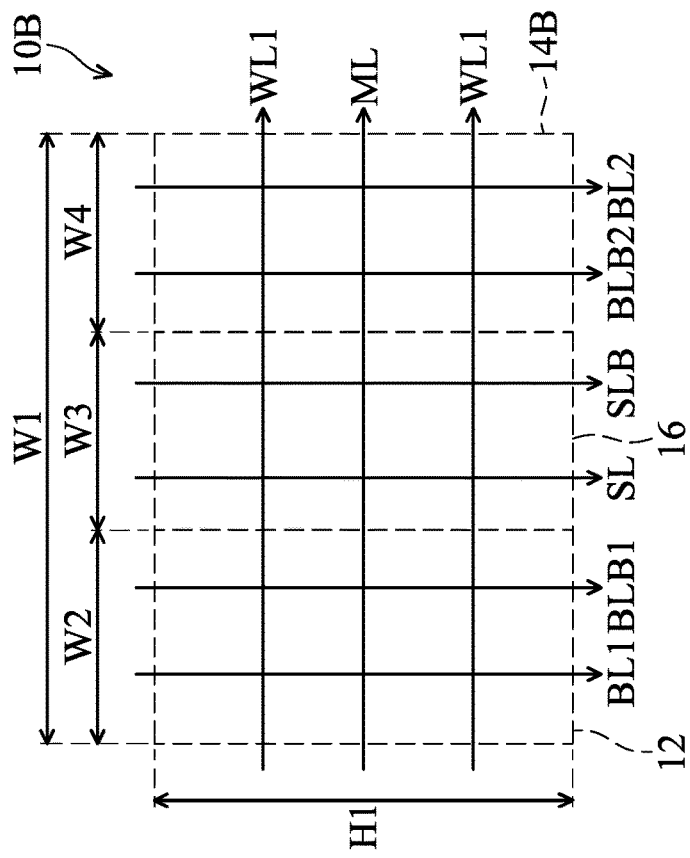
FIG. 2C shows an example illustrating the signal placement of the memory cell of FIG. 2A, in accordance with some embodiments of the disclosure.
Figure 2B:
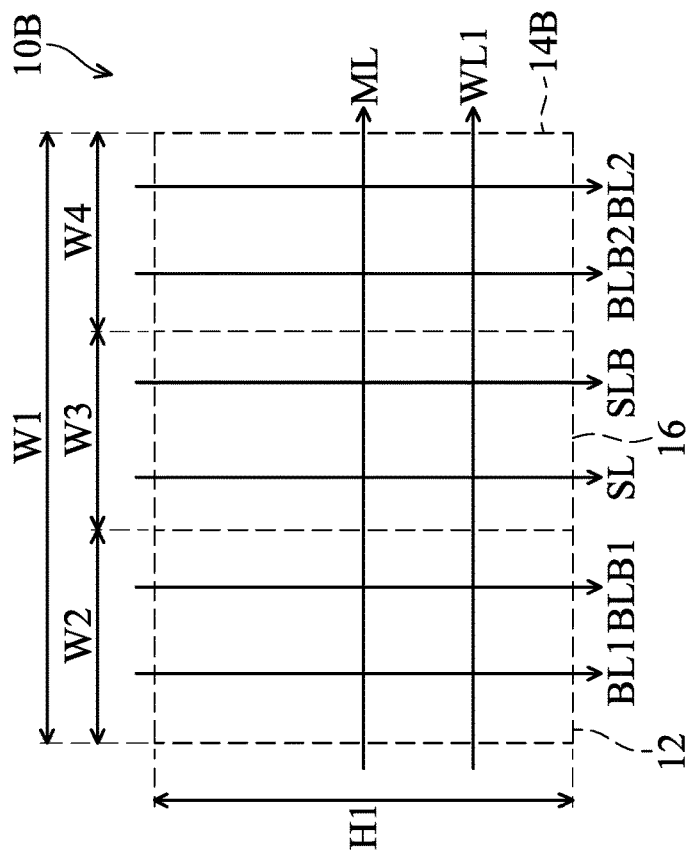
FIG. 2B shows an example illustrating the signal placement of the memory cell of FIG. 2A, in accordance with some embodiments of the disclosure.

FIG. 2B shows an example illustrating the signal placement of the memory cell 10B of FIG. 2A, in accordance with some embodiments of the disclosure. The memory cell 10B has a cell width W1 in the X-direction, and a cell height H1 in the Y-direction. The match cell 16 is disposed between the first data storage cell 12 and the second data storage cell 14B. In the memory cell 10B, the match cell 16, the first data storage cell 12 and the second data storage cell 14B have the same cell height H1. The match cell 16, the first data storage cell 12 and the second data storage cell 14B have the cell widths W2, W3 and W4, respectively. In some embodiments, the cell width W2 is equal to the cell width W4. In some embodiments, the cell widths W2 and W4 are greater than the cell width W3.

In FIG. 2B, the match line ML and the first word line WL1 extend in the X-direction and pass through the first data storage cells 12, the match cells 16, and the second data storage cells 14B of the memory cells 10B in the same row. The first bit line BL1 and the first complementary bit line BLB1 extend in the Y-direction and pass through the first data storage cells 12 of the memory cells 10B in the same column. The search line SL and the complementary search line SLB extend in the Y-direction and pass through the match cells 16 of the memory cells 10B in the same column. The second bit line BL2 and the second complementary bit line BLB2 extend in the Y-direction and pass through the second data storage cells 14B of the memory cells 10B in the same column.

FIG. 2C shows an example illustrating the signal placement of the memory cell 10B of FIG. 2A, in accordance with some embodiments of the disclosure. In such embodiments, two first word lines WL1 are used. In FIG. 2C, the match line ML and two first word lines WL1 extend in the X-direction and pass through the first data storage cells 12, the match cells 16, and the second data storage cells 14B of the memory cells 10B in the same row. Furthermore, the match line ML is disposed between the two first word lines WL1.

Figure 3:
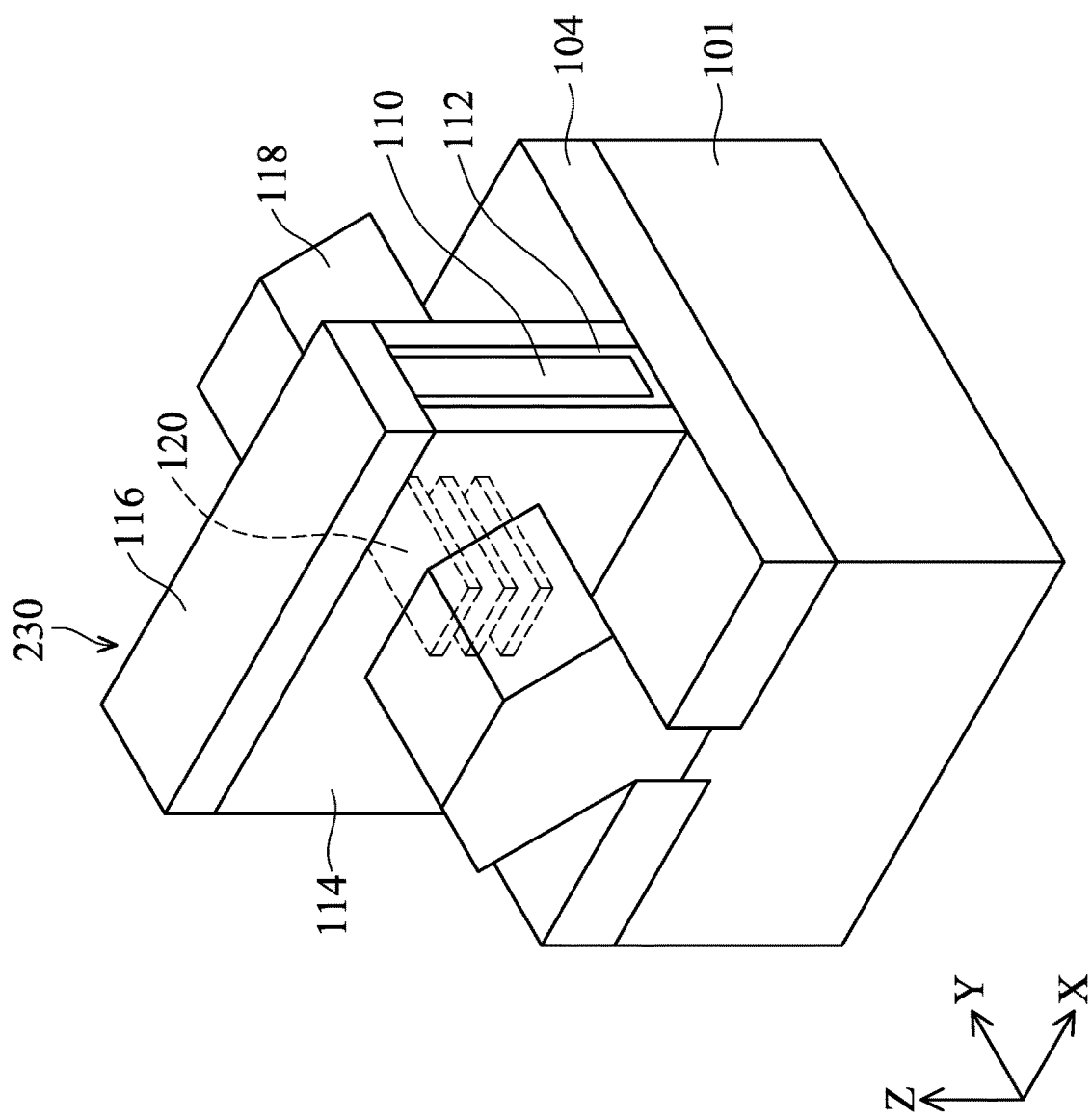
FIG. 3 shows a perspective view of an exemplary GAA transistor.

FIG. 3 shows a perspective view of an exemplary GAA transistor. The GAA transistor includes a substrate 101. The substrate 101 may contains a semiconductor material, such as bulk silicon (Si). In some other embodiments, the substrate 101 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 101 may also include an insulating layer, such as a silicon oxide layer, to have a silicon-on-insulator (SOI) structure or a germanium-on-insulator (GOI) structure. In some embodiments, after the resultant GAA transistor is formed, the substrate 101 may be removed by a suitable process (e.g., a chemical mechanical polishing (CMP) process) for forming back-side interconnections.

The GAA transistor also includes one or more nanostructures 120 (dash lines) extending in the Y-direction and vertically arranged (or stacked) in a Z-direction. More specifically, the nanostructures 120 are spaced from each other in the Z-direction. In some embodiments, the nanostructures 120 may also be referred to as channels, channel layers, nanosheets, or nanowires. The nanostructures 120 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 120 include silicon for N-type GAA transistors. In other embodiments, the nanostructures 120 include silicon germanium for P-type GAA transistors. In some embodiments, the nanostructures 120 are all made of silicon, and the type of GAA transistors depend on work function metal layer wrapping around the nanostructures 120.

The GAA transistor further includes a gate structure 230 including a gate electrode 110 and a gate dielectric layer 112. The gate dielectric layer 112 wraps around the nanostructures 120 and the gate electrode 110 wraps around the gate dielectric layer 112 (not shown). The gate electrode 110 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate electrode 110 may include a capping layer, a barrier layer, an n-type work function metal layer, a p-type work function metal layer, and a fill material (not shown). In some embodiments, the P-type transistors and the N-type transistors are formed by the same work function material. In some embodiments, the P-type transistors and the N-type transistors are made of different work function materials.

The gate dielectric layer 112 may include dielectric materials, such as silicon oxide, silicon nitride, silicon oxynitride, dielectric material(s) with high dielectric constant (high-k), or a combination thereof. Examples of high-k dielectric materials include $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

The gate spacers 114 are on sidewalls of the gate dielectric layer 112 and over the nanostructures 120 (not shown). The gate spacers 114 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 114 may include a single layer or a multi-layer structure.

The gate top dielectric layer 116 is over the gate dielectric layer 112, the gate electrode 110, and the nanostructures 120. The gate top dielectric layer 116 is used for contact etch protection layer. The material of gate top dielectric layer 116 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material. The thickness of the gate top dielectric layer 116 about 2 nm to about 60 nm.

The GAA transistor further includes epitaxially-grown materials 118. As shown in FIG. 3, two epitaxially-grown materials 118 are on opposite sides of the gate structure. The epitaxially-grown materials 118 serve as the source/drain features of the GAA transistor. Therefore, the epitaxially-grown materials 118 may also be referred to as source/drain, source/drain features, or source/drain nodes. In some embodiments, for an N-type GAA transistor, the epitaxially-grown materials 118 may include SiP, SiC, SiPC, SiAs, Si, or a combination thereof. In some embodiments, for a P-type GAA transistor, the epitaxially-grown materials 118 may include SiGe, SiGeC, Ge, Si, a boron-doped SiGe, boron and carbon doped SiGe, or a combination thereof.

The nanostructures 120 (dash lines) extends in the Y-direction to connect two epitaxially-grown materials 118. Such the nanostructures 120 and the epitaxially-grown materials 118 connected continuously with each other may be collectively referred to as an active area.

Isolation feature 104 is over the substrate 101 and under the gate dielectric layer 112, the gate electrode 110, and the gate spacers 114. The isolation feature 104 is used for isolating the GAA transistor from other devices. In some embodiments, the isolation feature 104 may include different structures, such as shallow trench isolation (STI) structure, deep trench isolation (DTI) structure. Therefore, the isolation feature 104 is also referred as to as a STI feature or DTI feature.

Figure 4:
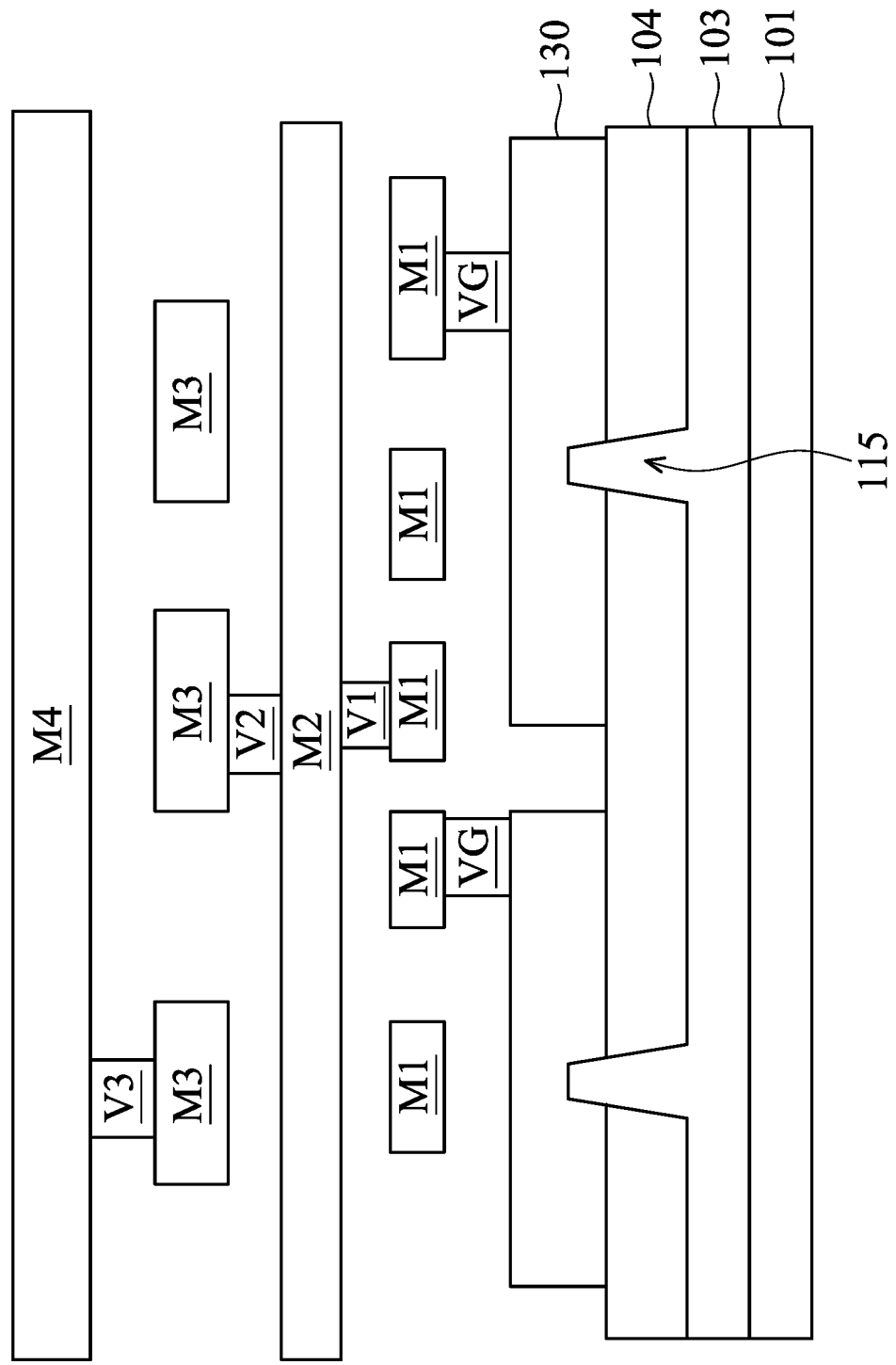
FIG. 4 shows a cross sectional view of a semiconductor device, in accordance with some embodiments of the disclosure.

FIG. 4 shows a cross sectional view of a semiconductor device, in accordance with some embodiments of the disclosure. In the semiconductor device, one or more memory cells 10 as illustrated in the disclosure are formed, and the memory cells 10 includes the FinFET transistors. Furthermore, some components of the semiconductor device are not depicted for clarity of FIG. 4.

The semiconductor device includes a well region 103 over the substrate 101. In some embodiments, the well region 103 is a P-type well region, and the material of the P-type well region includes Si with Boron (B) doping. In some embodiments, the well region 103 is an N-type well region, and the material of the N-type well region includes Si with Phosphorus (P) doping. The fins 115 form the active regions over the well region 103, and the gate structures 130 are formed over the fins 115.

The gate vias VG are formed over and connected to the gate structures 130 (e.g., the gate structures). Isolation feature 104 is over the well region 103 and under the gate structure 130. The isolation feature 104 is used for isolating the fin 115 of a transistor from other devices. In some embodiments, the isolation feature 104 may include different structures, such as shallow trench isolation (STI) structure, deep trench isolation (DTI) structure. Therefore, the isolation feature 104 is also referred as to as a STI feature or DTI feature.

The semiconductor device further includes the vias V1, V2, and V3 and the metal lines M1, M2, M3 and M4 in an inter-metal dielectric (IMD). In some embodiments, the IMD may be multilayer structure, such as one or more dielectric layers. The metal lines M1, M2, M3 and M4 are formed in respective conductive layers, which are also referred to as metal layers. Moreover, the vias VG, V0 (not shown), V1, V2, and V3 are formed in respective via layers over the gate structures 130.

In FIG. 4, the conductive layers of the semiconductor device include a first metal layer having first conductive features (e.g., the metal lines MD, a second metal layer having second conductive features (e.g., the metal lines M2), a third metal layer having third conductive features (e.g., the metal lines M3), and a fourth metal layer having fourth conductive features (e.g., the metal lines M4).

The via layers of semiconductor device include a base via layer having the vias V0 (not shown) and the vias VG, a first via layer having the vias V1, a second via layer having the vias V2, and a third via layer having the vias V3. The vias V0 and the vias VG are arranged to connect at least some of the conductive structures (contacts) and the gate structures 130 with corresponding first metal lines M1. The vias V1 are arranged to connect at least some first metal lines M1 with the corresponding second metal lines M2. The vias V2 are arranged to connect at least some second metal lines M2 with the corresponding third metal lines M3. The vias V3 are arranged to connect at least some third metal lines M3 with the corresponding fourth metal lines M4.

FIG. 4 is used as to demonstrate the spatial relationship among various metal layers and via layers. In some embodiments, the numbers of conductive features at various layers are not limited to the example depicted in FIG. 4. In some embodiments, there are one or more metal layers and one or more via layers over the fourth metal lines M4.

Figure 5A:
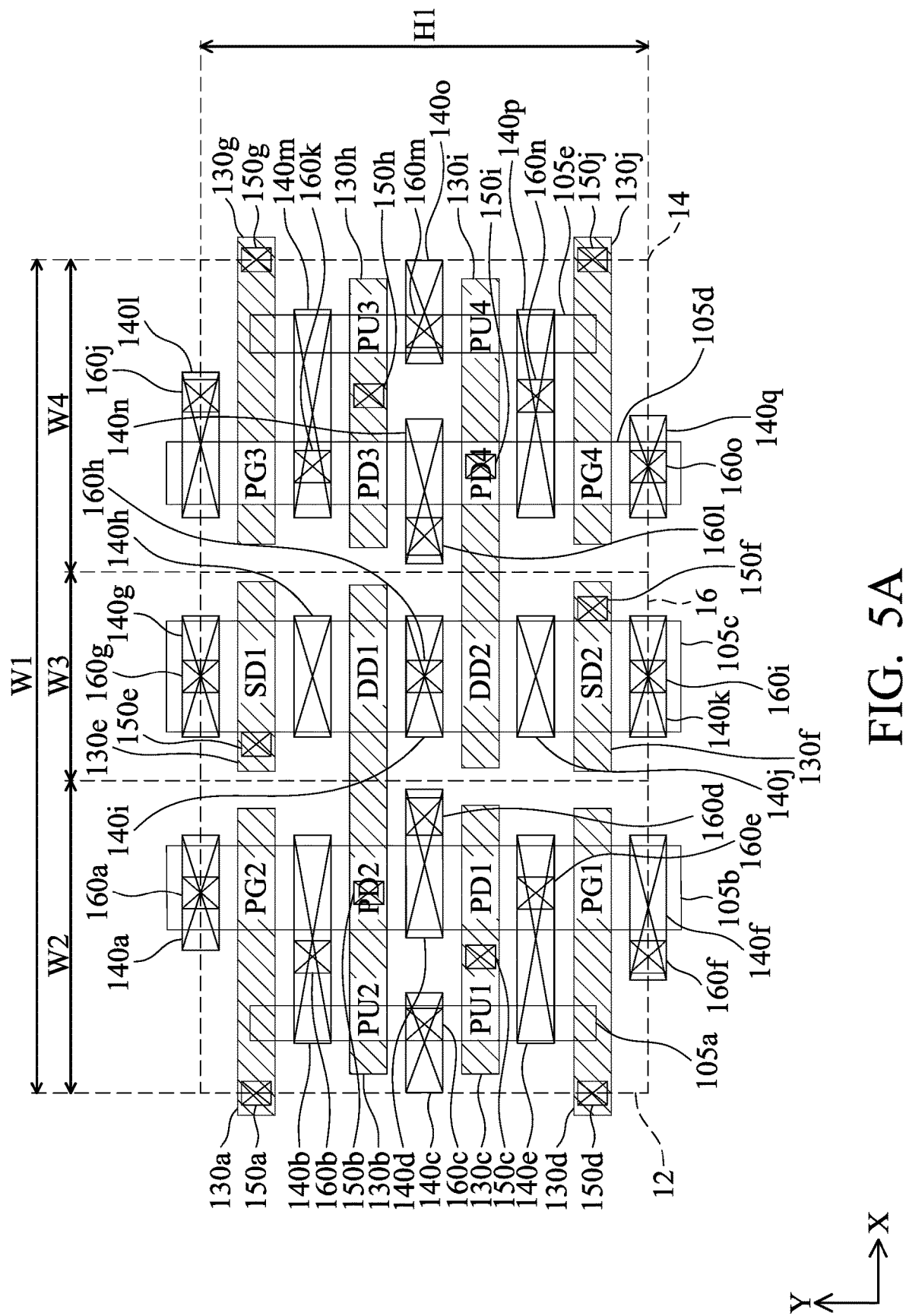
FIG. 5A shows a top view of the memory cell in a semiconductor device, with all the depictions regarding components under the first metal layer of FIG. 4, in accordance with some embodiments of the disclosure.
Figure 5B:
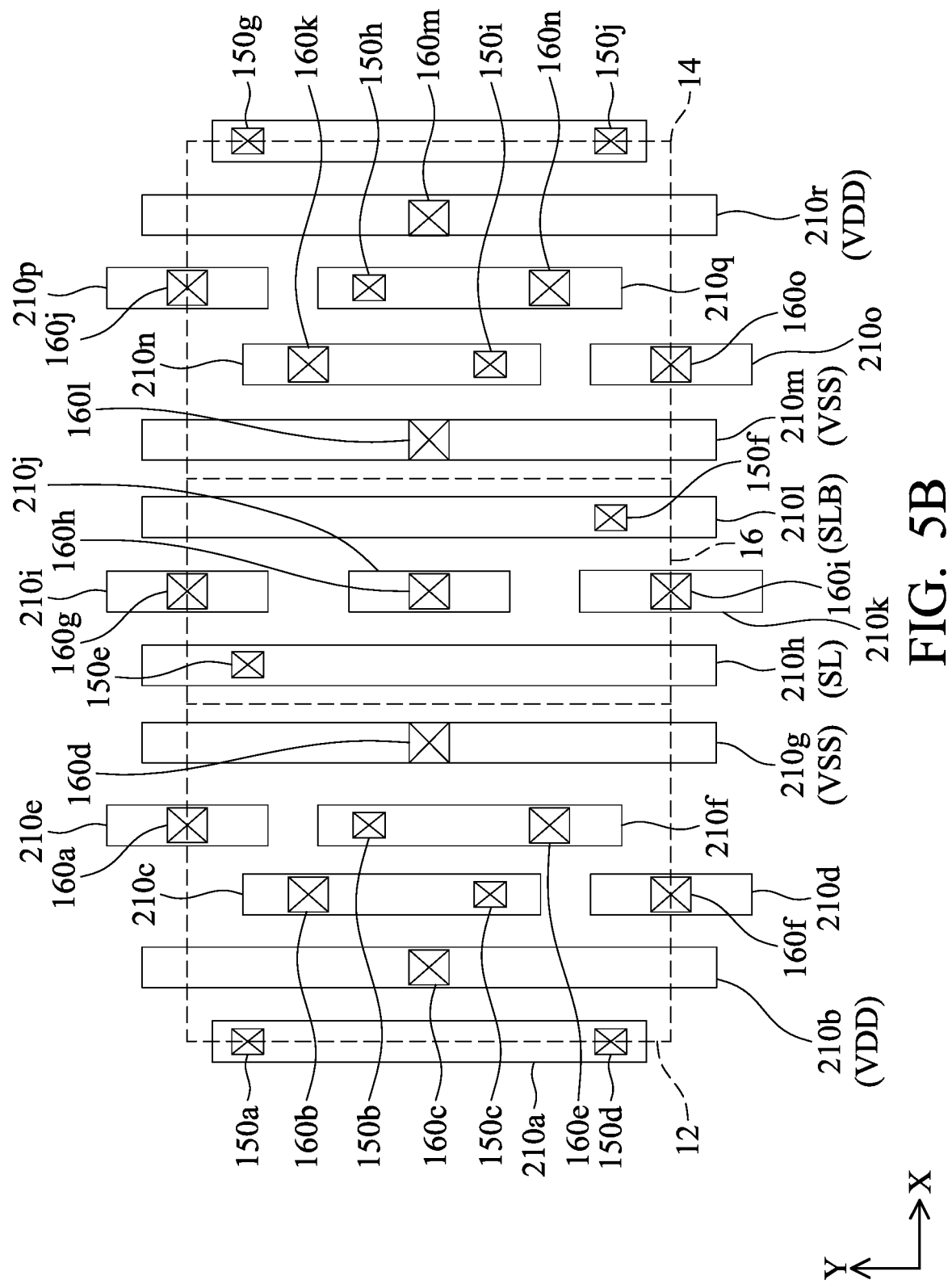
FIG. 5B shows a top view of the memory cell of FIG. 5A, with all the depictions regarding components in the first metal layer, in accordance with some embodiments of the disclosure.
Figure 5C:
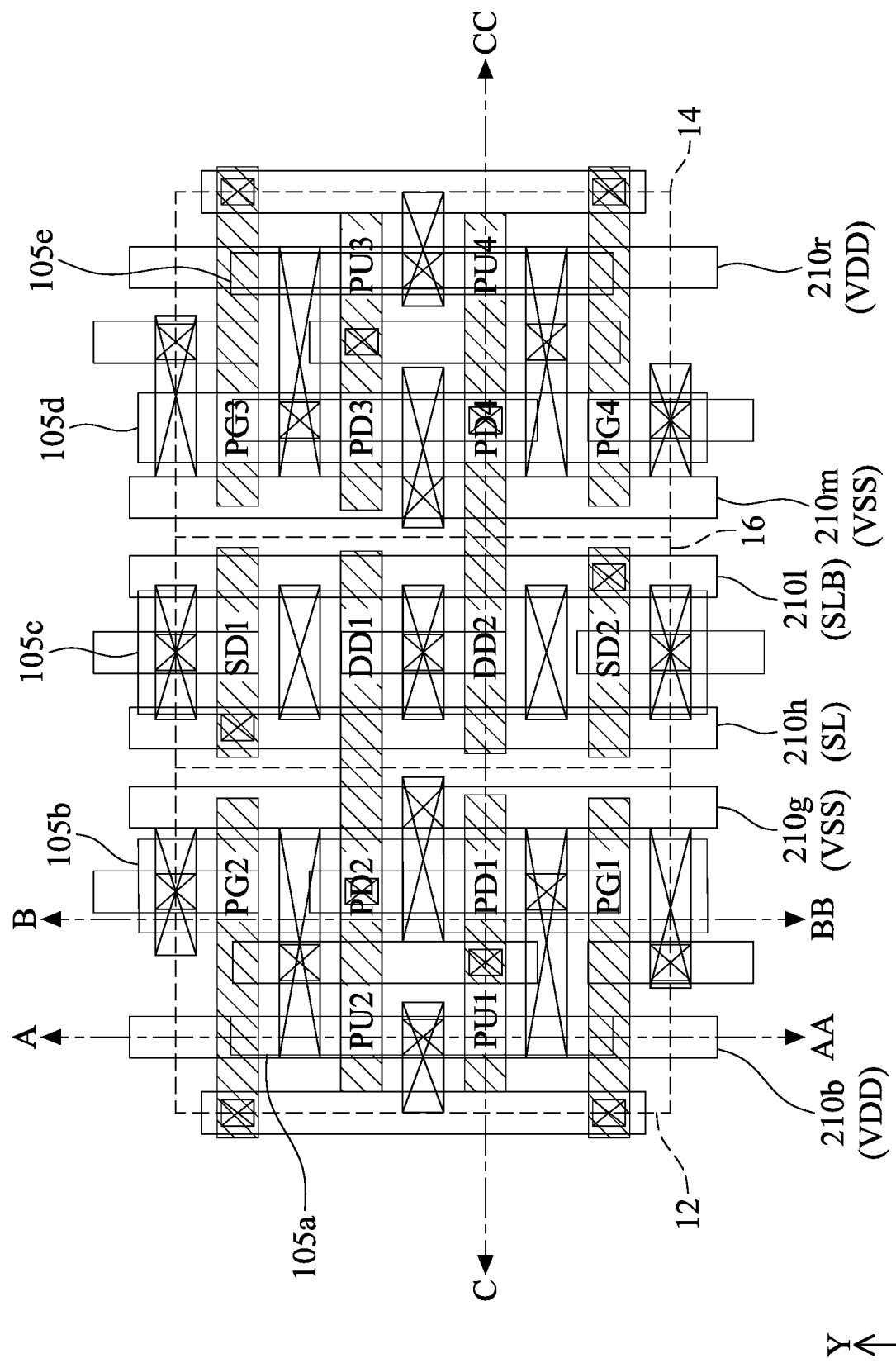
FIG. 5C shows a top view of the memory cell of FIGS. 5A and 5B, with all the depictions regarding components in and under the first metal layer.

FIG. 5A shows a top view of the memory cell in a semiconductor device, with all the depictions regarding components under the first metal layer of FIG. 4, in accordance with some embodiments of the disclosure. FIG. 5B shows a top view of the memory cell of FIG. 5A, with all the depictions regarding components in the first metal layer, in accordance with some embodiments of the disclosure. FIG. 5C shows a top view of the memory cell of FIGS. 5A and 5B, with all the depictions regarding components in and under the first metal layer. In FIGS. 5A through 5C, the same components in the memory cell are given the same reference numbers.

The memory cell includes a first data storage cell 12, a second data storage cell 14, and a match cell 16. The boundaries of the first data storage cell 12, the second data storage cell 14, and the match cell 16 are indicated by dashed lines. In such embodiments, the second data storage cell 14 may be the second data storage cell 14A of FIG. 1A or the second data storage cell 14B of FIG. 2A. Furthermore, the transistors in FIG. 5A are the GAA transistors.

As described above, the memory cell includes a cell height H1 along the Y direction and a cell width W1 along the X direction. In this embodiment, the cell height H1 spans over a total of 4 gate structures and is measured at about 4 gate pitches. Each gate pitch includes a gate length along the Y direction and a gate spacing between two adjacent gate structures along the Y direction.

The first data storage cell 12 includes the active regions 105a and 105b. The match cell 16 includes the active region 105c. The second data storage cell 14 includes the active regions 105d and 105e. Each of the active regions 105a through 105e is formed by the nanostructures formed on the substrate. In some embodiments, the nanostructures may also be referred to as channels, channel layers, nanosheets, or nanowires. The nanostructures may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures include silicon for N-type GAA transistors. In other embodiments, the nanostructures include silicon germanium for P-type GAA transistors. In some embodiments, the nanostructures are all made of silicon, and the type of GAA transistors depend on work function metal layer wrapping around the nanostructures. In the X-direction, the memory cell includes less active regions (lower down to the 5 active regions 105a through 105e) to have highly capability for cell scaling.

In the semiconductor device of FIGS. 5A and 5B, the source/drain contacts 140a through 140q and the gate structures 130a through 130j extend in the X direction. The metal lines 210a through 210s are formed in the first metal layer and extend in the Y direction. The source/drain contacts 140a through 140q are configured to connect the source/drain regions of the transistors. Source/drain region(s) may refer to a source or a drain, individually or collectively dependent upon the context.

In the first data storage cell 12, a gate structure 130a forms the pass-gate transistor PG2 with the active region 105b. A gate structure 130b forms the pull-up transistor PU2 with the active region 105a and forms the pull-down transistor PD2 with the active region 105b. A gate structure 130c forms the pull-up transistor PU1 with the active region 105a and forms the pull-down transistor PD1 with the active region 105b. A gate structure 130d forms the pass-gate transistor PG1 with the active region 105b. In some embodiments, the gate structures 130a and 130d are shared with the adjacent memory cell.

The gate structures 130a and 130d are electrically connected to the metal line 210a through the gate vias 150a and 150d. The metal line 210a functions as a landing pad (or a landing line) of the first word line WL1 for the first data storage cell 12. The gate structure 130b is electrically connected to the metal line 210f through the gate via 150b. The metal line 210f functions as a local connection line of the first storage node SN1 for the first data storage cell 12. The gate structure 130c is electrically connected to the metal line 210c through the gate via 150c. The metal line 210c functions as a local connection line of the first complementary storage node SNB1 for the first data storage cell 12.

In the first data storage cell 12, the source/drain contacts 140a and 140b overlap the active region 105b and correspond to the source/drain features of the pass-gate transistor PG2. The source/drain contacts 140b and 140c overlap the active region 105a and correspond to the source/drain features of the pull-up transistor PU2. The source/drain contacts 140b and 140d overlap the active region 105b and correspond to the source/drain features of the pull-down transistor PD2. The source/drain contacts 140c and 140e overlap the active region 105a and correspond to the source/drain features of the pull-up transistor PU1. The source/drain contacts 140d and 140e overlap the active region 105b and correspond to the source/drain features of the pull-down transistor PD1. The source/drain contacts 140e and 140f overlap the active region 105b and correspond to the source/drain features of the pass-gate transistor PG1.

The source/drain contact 140a is electrically connected to the metal line 210e through the via 160a. The metal line 210*e* functions as a landing pad of the first complementary bit line BLB1 for the first data storage cell 12. The source/drain contact 140*b* is shared by the pass-gate transistor PG2, the pull-up transistor PU2 and the pull-down transistor PD2. The source/drain contact 140*b* is electrically connected to the metal line 210*c* through the via 160*b* so as to connect to the gate structure 130*c*. The source/drain contact 140*c* is shared by the pull-up transistors PU2 and PU1. The source/drain contact 140*c* is electrically connected to the metal line 210*b* through the via 160*c*. The metal line 210*b* functions as the VDD line (or VDD conductor) for the first data storage cell 12. The source/drain contact 140*d* is shared by the pull-down transistors PD2 and PD1. The source/drain contact 140*d* is electrically connected to the metal line 210*g* through the via 160*d*. The metal line 210*g* functions as the VSS line (or VSS conductor) for the first data storage cell 12. The source/drain contact 140*e* is shared by the pass-gate transistor PG1, the pull-up transistor PU1 and the pull-down transistor PD1. The source/drain contact 140*e* is electrically connected to the metal line 210*f* through the via 160*e* so as to connect to the gate structure 130*b*. The source/drain contact 140*f* is electrically connected to the metal line 210*d* through the via 160*f*. The metal line 210*d* functions as a landing pad of the first bit line BL1 for the first data storage cell 12.

In the second data storage cell 14, a gate structure 130*g* forms the pass-gate transistor PG3 with the active region 105*d*. A gate structure 130*h* forms the pull-up transistor PU3 with the active region 105*e* and forms the pull-down transistor PD3 with the active region 105*d*. A gate structure 130*i* forms the pull-up transistor PU4 with the active region 105*e* and forms the pull-down transistor PD4 with the active region 105*d*. A gate structure 130*j* forms the pass-gate transistor PG4 with the active region 105*d*. In some embodiments, the gate structures 130*g* and 130*j* are shared with the adjacent memory cell.

The gate structures 130*g* and 130*j* are electrically connected to the metal line 210*s* through the gate vias 150*g* and 150*j*. The metal line 210*s* functions as a landing pad (or a landing line) of the second word line WL2 for the second data storage cell 14. The gate structure 130*h* is electrically connected to the metal line 210*q* through the gate via 150*h*. The metal line 210*q* functions as a local connection line of the second storage node SN2 for the second data storage cell 14. The gate structure 130*i* is electrically connected to the metal line 210*n* through the gate via 150*i*. The metal line 210*n* functions as a local connection line of the second complementary storage node SNB2 for the second data storage cell 14.

In the second data storage cell 14, the source/drain contacts 140*l* and 140*m* overlap the active region 105*d* and correspond to the source/drain features of the pass-gate transistor PG3. The source/drain contacts 140*m* and 140*o* overlap the active region 105*e* and correspond to the source/drain features of the pull-up transistor PU3. The source/drain contacts 140*m* and 140*n* overlap the active region 105*d* and correspond to the source/drain features of the pull-down transistor PD3. The source/drain contacts 140*o* and 140*p* overlap the active region 105*e* and correspond to the source/drain features of the pull-up transistor PU4. The source/drain contacts 140*n* and 140*p* overlap the active region 105*d* and correspond to the source/drain features of the pull-down transistor PD4. The source/drain contacts 140*p* and 140*q* overlap the active region 105*d* and correspond to the source/drain features of the pass-gate transistor PG4.

The source/drain contact 140*l* is electrically connected to the metal line 210*p* through the via 160*j*. The metal line 210*p* functions as a landing pad of the second bit line BL2 for the second data storage cell 14. The source/drain contact 140*m* is shared by the pass-gate transistor PG3, the pull-up transistor PU3 and the pull-down transistor PD3. The source/drain contact 140*m* is electrically connected to the metal line 210*n* through the via 160*k* so as to connect to the gate structure 130*i*. The source/drain contact 140*o* is shared by the pull-up transistors PU3 and PU4. The source/drain contact 140*o* is electrically connected to the metal line 210*r* through the via 160*m*. The metal line 210*r* functions as the VDD line (or VDD conductor) for the second data storage cell 14. The source/drain contact 140*n* is shared by the pull-down transistors PD3 and PD4. The source/drain contact 140*n* is electrically connected to the metal line 210*m* through the via 160*l*. The metal line 210*m* functions as the VSS line (or VSS conductor) for the second data storage cell 14. The source/drain contact 140*p* is shared by the pass-gate transistor PG4, the pull-up transistor PU4 and the pull-down transistor PD4. The source/drain contact 140*p* is electrically connected to the metal line 210*q* through the via 160*n* so as to connect to the gate structure 130*h*. The source/drain contact 140*q* is electrically connected to the metal line 210*o* through the via 160*o*. The metal line 210*o* functions as a landing pad of the second complementary bit line BLB2 for the second data storage cell 14.

In the match cell 16, a gate structure 130*e* forms the search transistor SD1 with the active region 105*c*. The gate structure 130*b* forms the data transistor DD1 with the active region 105*c*. The gate structure 130*i* forms the data transistor DD2 with the active region 105*c*. A gate structure 130*f* forms the search transistor SD2 with the active region 105*c*. The gate structure 130*b* is shared by the data transistor DD1, the pull-up transistor PU2 and the pull-down transistor PD2, and the gate structure 130*i* is shared by the data transistor DD2, the pull-up transistor PU4 and the pull-down transistor PD4. The gate structure 130*e* is electrically connected to the metal line 210*h* through the gate via 150*e*. The metal line 210*h* functions as the search line SL for the match cell 16. The gate structure 130*f* is electrically connected to the metal line 210*l* through the gate via 150*f*. The metal line 210*l* functions as the complementary search line SLB for the match cell 16.

In the match cell 16, the source/drain contacts 140*g* and 140*h* overlap the active region 105*c* and correspond to the source/drain features of the search transistor SD1. The source/drain contacts 140*h* and 140*i* overlap the active region 105*c* and correspond to the source/drain features of the data transistor DD1. The source/drain contacts 140*i* and 140*j* overlap the active region 105*c* and correspond to the source/drain features of the data transistor DD2. The source/drain contacts 140*j* and 140*k* overlap the active region 105*c* and correspond to the source/drain features of the search transistor SD2.

The source/drain contact 140*g* is electrically connected to the metal line 210*i* through the via 160*g*. The metal line 210*i* functions as the VSS line (or VSS conductor) for the match cell 16. The source/drain contact 140*i* is electrically connected to the metal line 210*j* through the via 160*h*. The metal line 210*j* functions as a landing pad of the match line ML for the match cell 16. The source/drain contact 140*k* is electrically connected to the metal line 210*k* through the via 160*i*. The metal line 210*k* functions as the VSS line (or VSS conductor) for the match cell 16.

As shown in FIG. 5C, the memory cell has fully symmetry devices layout for cell stability (device mismatch) improvement. For example, the active region 105*c* is disposed in the middle of the memory cell. The active region 105*b* is symmetrical to the active region 105*d*, and the active region 105a is symmetrical to the active region 105e. Similarly, the gate structure 103b is symmetrical to the gate structure 103i, and the gate structure 103e is symmetrical to the gate structure 103f.

Figure 6A:
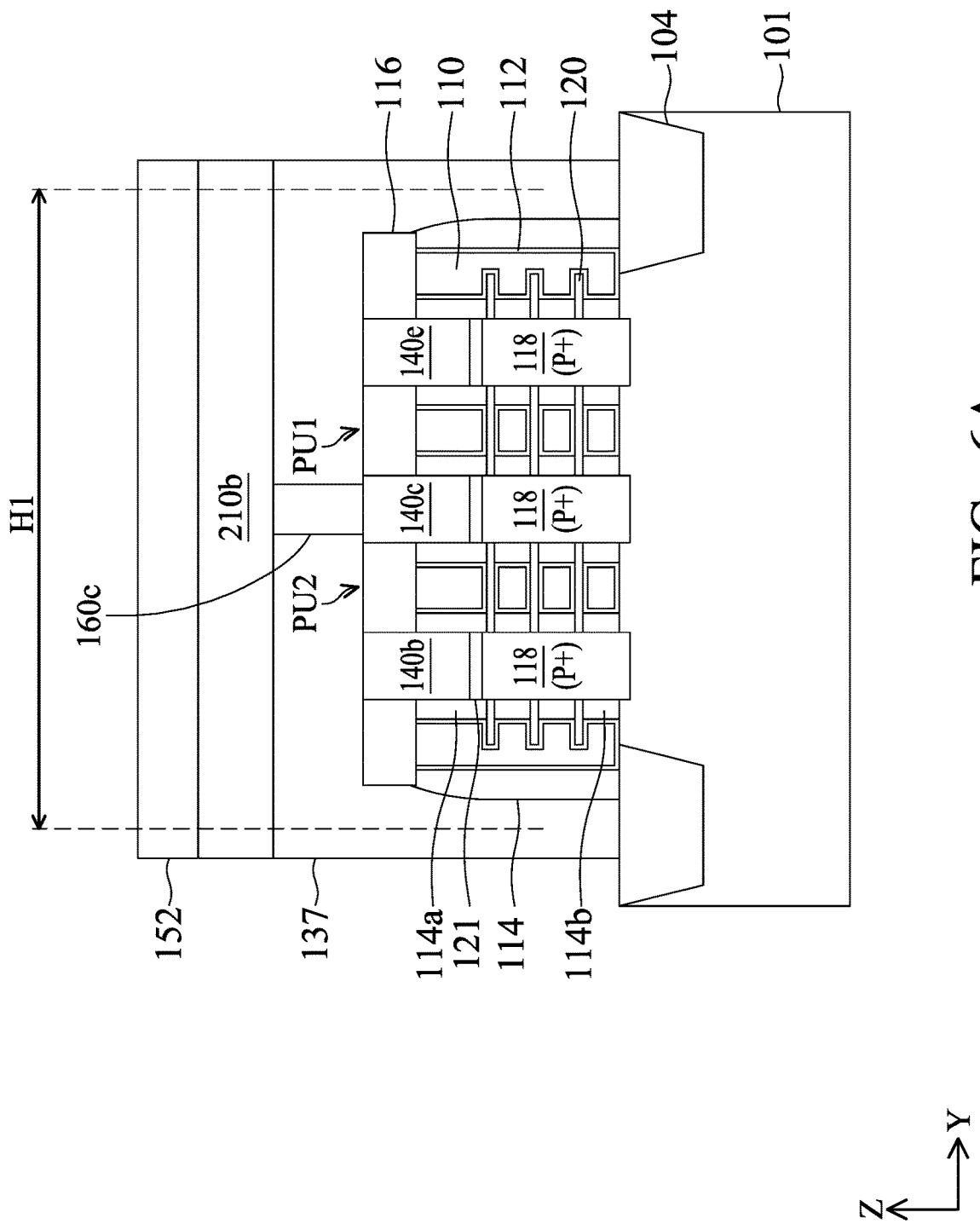
FIG. 6A shows a cross sectional view of the semiconductor device along a line A-AA in FIG. 5C, in accordance with some embodiments of the disclosure.

FIG. 6A shows a cross sectional view of the semiconductor device along a line A-AA in FIG. 5C, in accordance with some embodiments of the disclosure. As described above, the memory cell has a cell height (or cell pitch) H1 measurable in the Y-direction. In FIG. 6A, the cross sectional view of the pull-up transistors PU1 and PU2 of the first data storage cell 12 are illustrated, and the pull-up transistors PU1 and PU2 are P-type GAA FETs.

Figure 6B:
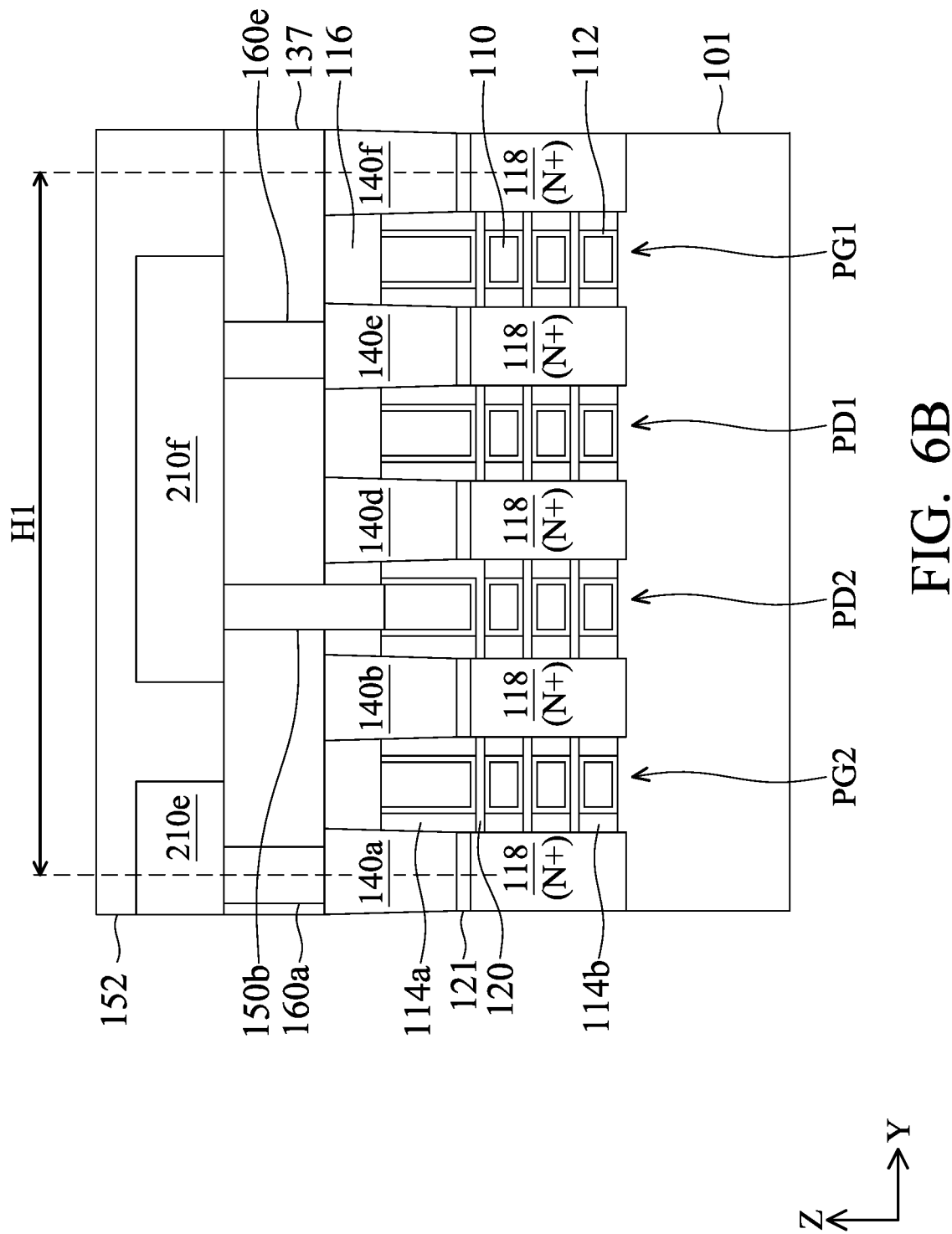
FIG. 6B shows a cross sectional view of the semiconductor device along a line B-BB in FIG. 5C, in accordance with some embodiments of the disclosure.

FIG. 6B shows a cross sectional view of the semiconductor device along a line B-BB in FIG. 5C, in accordance with some embodiments of the disclosure. In FIG. 6B, the cross sectional view of the pull-down transistors PD1 and PD2 and the pass-gate transistors PG1 and PG2 of the first data storage cell 12 are illustrated, and the pull-down transistors PD1 and PD2 and the pass-gate transistors PG1 and PG2 are N-type GAA FETs.

Figure 6C:
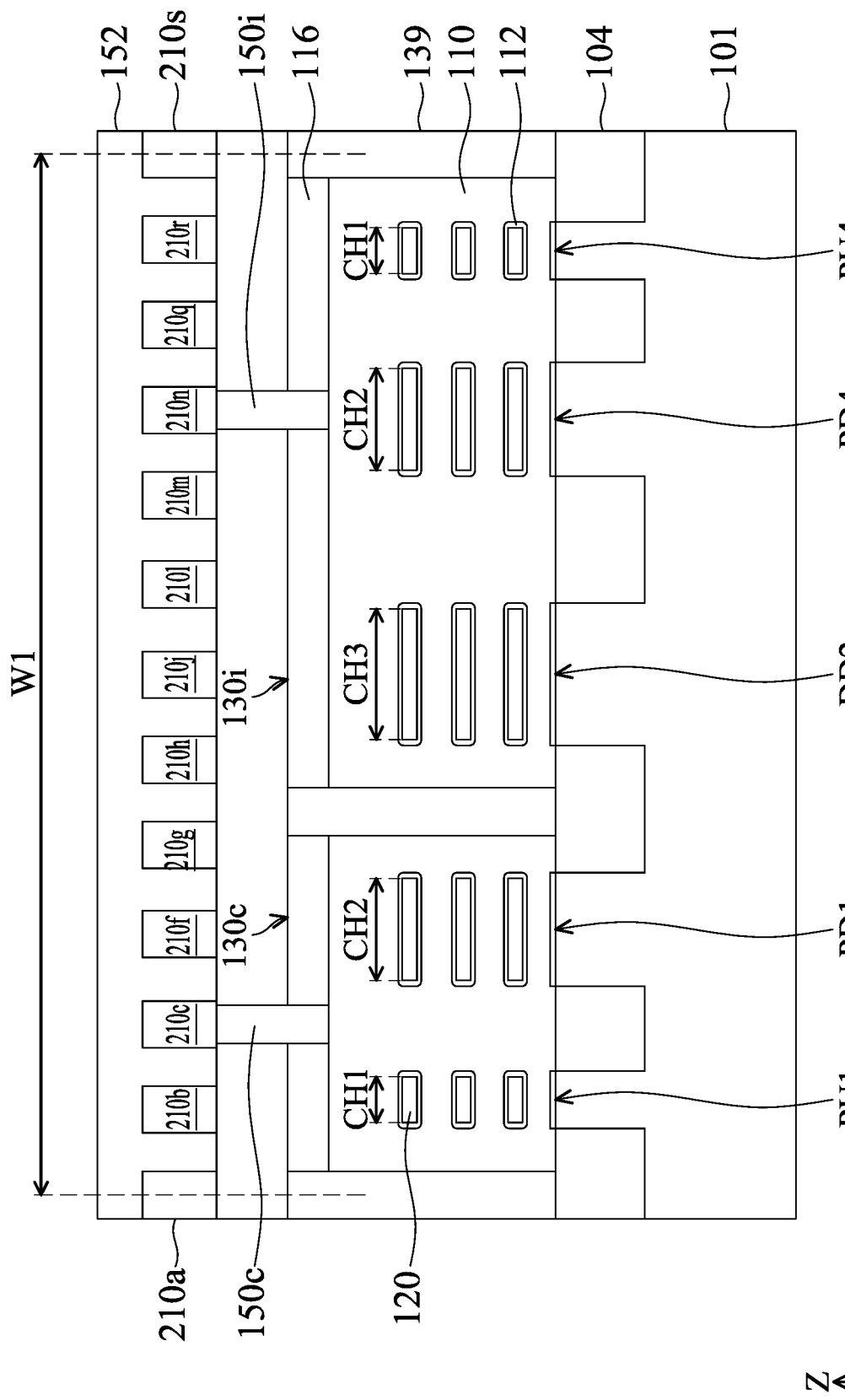
FIG. 6C shows a cross sectional view of the semiconductor device along a line C-C in FIG. 5C, in accordance with some embodiments of the disclosure.

FIG. 6C shows a cross sectional view of the semiconductor device along a line C-C in FIG. 5C, in accordance with some embodiments of the disclosure. As described above, the memory cell has the cell width (or cell pitch) W1 measurable in the X direction. In FIG. 6C, the cross sectional view of the pull-up transistor PU1 and the pull-down transistor PD1 of the first data storage cell 12, the data transistor DD2 of the match cell 16, and the pull-up transistor PU4 and the pull-down transistor PD4 of the second data storage cell 14A/14B are illustrated.

As shown in FIGS. 6A through 6C, the gate top dielectric layers 116 are over the gate structures 130a through 130j, the gate spacers 114, and the nanostructures 120. The material of the gate top dielectric layers 116 is discussed above.

The gate spacers 114 are on sidewalls of the gate structures 130a through 130j, as shown in FIGS. 6A and 6B. The gate spacers 114 may include the top spacers 114a and the inner spacers 114b. The top spacers 114a and the inner spacers 114b may be about 4 nm to about 10 nm. The top spacers 114a are over the nanostructures 120 and on top sidewalls of the gate structures 130a through 130j. The top spacers 114a may include multiple dielectric materials and be selected from a group consist of $SiO_2$, $Si_3N_4$, carbon doped oxide, nitrogen doped oxide, porous oxide, air gap, or a combination thereof. The inner spacers may include a dielectric material having higher K value (dielectric constant) than the top spacers and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof.

The nanostructures 120 are wrapped by the gate structures 130a through 130j to serve as channels or channel layers of the transistors in the memory cell. In FIGS. 6A through 6C, each GAA transistor has three nanostructures 120 vertically arranged (or stacked) in the Z-direction. In other embodiments, each GAA transistor has the more or less nanostructures 120 vertically arranged (or stacked) in the Z-direction, e.g., the number of nanostructures 120 may be 2 to 10.

In the memory cell, the active regions 105a through 105e may have different widths in the X direction. In some embodiments, the widths of the active structures 105a through 105e are determined according to the channel width of the channel width corresponding to the respective nanostructures 120.

As shown in FIG. 6C, the nanostructures 120 of the pull-up transistors PU1 and PU4 have a channel width CH1 in the X direction, and the nanostructures 120 of the pull-down transistors PD1 and PF4 have a channel width CH2 in the X direction. Furthermore, the nanostructures 120 of the data transistor DD2 have a channel width CH3 in the X direction. In such embodiments, the channel width CH2 is greater than the channel width CH1 (i.e., CH2>CH1), and the channel width CH3 is greater than the channel width CH2 (i.e., CH3>CH2).

Each source/drain feature 118 is disposed between two adjacent gate structures and contact the nanostructures 120 of the transistors, as shown in FIGS. 6A and 6B. Therefore, each source/drain feature 118 is shared by two adjacent gate structures. In some embodiments, the source/drain features 118 may be also referred to as common source/drain features. As described above, the source/drain features 118 is formed by the epitaxially-grown materials discussed above. For an N-type GAA transistor, the epitaxially-grown materials 118 may include the materials with N-type conductivity, such as SiP, SiC, SiPC, SiAs, Si, or a combination thereof. For a P-type GAA transistor, the epitaxially-grown materials 118 may include the materials with P-type conductivity, such as SiGe, SiGeC, Ge, Si, a boron-doped SiGe, boron and carbon doped SiGe, or a combination thereof.

The silicide features 121 are formed between the source/drain contacts 140a through 140q and the source/drain features 118. The silicide features 121 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

The dielectric feature 137 may be an inter-layer dielectric (ILD), and the dielectric feature 152 may be an inter-metal dielectric (IMD). The dielectric features 137 and 152 may include one or more dielectric layers including dielectric materials, such as tetraethylorthosilicate (TEOS) oxide, undoped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

In some embodiments, the materials of the source/drain contact, the vias and metal lines in the memory cell are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

In FIG. 6A, the metal line 210b extends in the Y direction and overlap the pull-up transistors PU1 and PU2. The metal line 210b is electrically connected to the source/drain contact 140c through the via 160c.

In FIG. 6B, the metal lines 210f and 210e extend in the Y direction, and the metal line 210f overlap the pull-down transistors PD1 and PD2. The metal line 210e is electrically connected to the source/drain contact 140a through the via 160a. The metal line 210f is electrically connected to the source/drain contact 140e through the via 160e and to the gate structure 130b through the gate via 150b.

In FIG. 6C, the metal line 210c is electrically connected to the source/drain contact 140a through the via 160a. The metal line 210f is electrically connected to the gate structure 130c through the gate via 150c, and the metal line 210n is electrically connected to the gate structure 130i through the gate via 150i.

Figure 7:
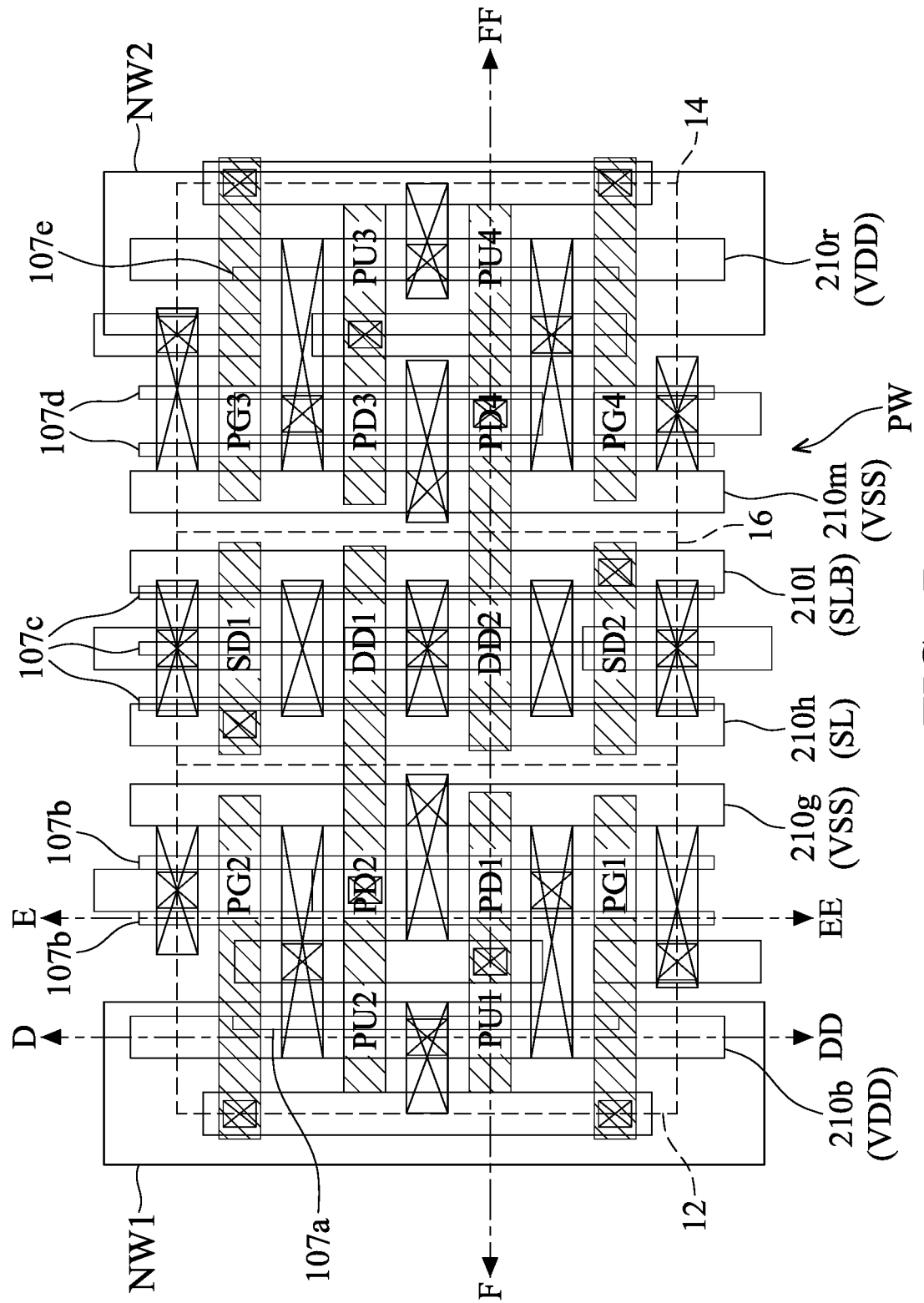
FIG. 7 shows is a top view of the memory cell in a semiconductor device, with all the depictions regarding components in and under the first metal layer, in accordance with some embodiments of the disclosure.

FIG. 7 shows is a top view of the memory cell in a semiconductor device, with all the depictions regarding components in and under the first metal layer, in accordance with some embodiments of the disclosure. Components in the memory cell of FIG. 5C that are the same or similar to those in the memory cell of FIG. 7 are given the same reference numbers, and detailed description thereof is thus omitted. In this embodiment, the transistors in the memory cell are fin-like field effect transistors (FinFETs). In other words, the active regions of the FIG. 7 are formed by the fins 107a through 107e.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The memory cell includes a substrate (not labeled) having a P-type well region PW and the N-type well regions NW1 and NW2. The P-type well region is disposed between the N-type well regions NW1 and NW2. The first data storage cell 12 is formed over the N-type well region NW1 and the P-type well region PW. The match cell 16 is formed over the P-type well region PW. The second data storage cell 14 is formed over the N-type well region NW2 and the P-type well region PW. In such embodiments, the second data storage cell 14 may be the second data storage cell 14A of FIG. 1A or the second data storage cell 14B of FIG. 2A.

The first data storage cell 12 includes the active regions formed by the fins 107a and 107b extending along the Y direction. The fin 107a is formed in the N-type well region NW1, and the fin 107a is shared by the pull-up transistors PU1 and PU2. The two fins 107b are formed in the P-type well region PW1, and the fins 107b are shared by the pull-down transistors PD1 and PD2 and the pass-gate transistors PG1 and PG2. The match cell 16 includes the active regions formed by the fins 107c extending along the Y direction. The three fins 107c are formed in the P-type well region PW, and the fins 107c are shared by the search transistors SD1 and SD2 and the data transistors DD1 and DD2. The second data storage cell 14 includes the active regions formed by the fins 107d and 107e extending along the Y direction. The fin 107e is formed in the N-type well region NW2, and the fin 107e is shared by the pull-up transistors PU3 and PU4. The two fins 107d are formed in the P-type well region PW, and the fins 107d are shared by the pull-down transistors PD3 and PD4 and the pass-gate transistors PG3 and PG4.

In FIG. 7, the fin number of the search transistors SD1 and SD2 and the data transistors DD1 and DD2 is greater than the fin number of the pull-down transistors PD1 through PD4 and the pass-gate transistors PG1 through PG4. Moreover, the fin number of the pull-down transistors PD1 through PD4 and the pass-gate transistors PG1 through PG4 is greater than the fin number of the pull-up transistors PU1 through PU4.

Figure 8A:
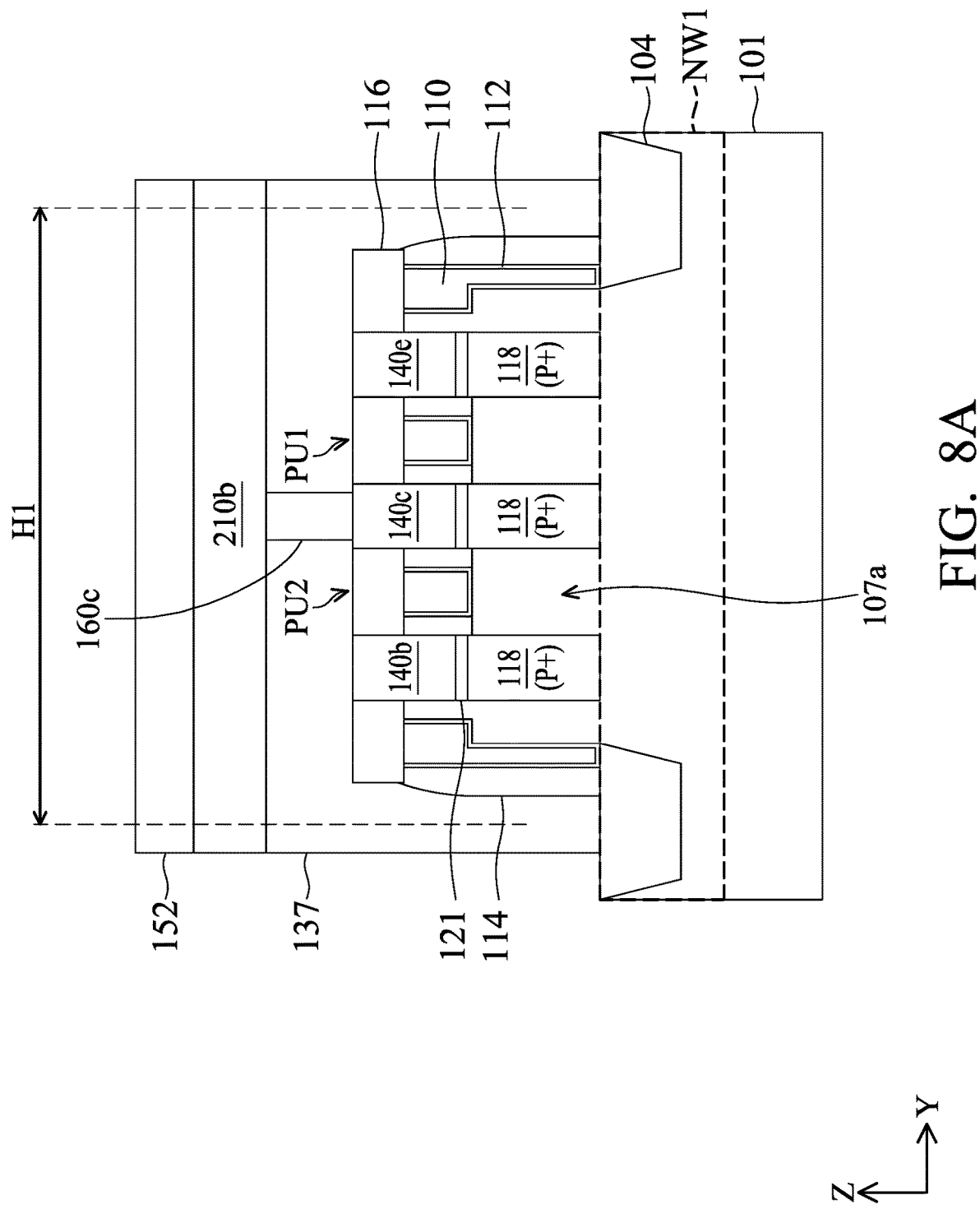
FIG. 8A shows a cross sectional view of the semiconductor device along a line D-DD in FIG. 7, in accordance with some embodiments of the disclosure.

FIG. 8A shows a cross sectional view of the semiconductor device along a line D-DD in FIG. 7, in accordance with some embodiments of the disclosure. As described above, the memory cell have a cell height (or cell pitch) H1 measurable in the Y direction. In FIG. 8A, the cross sectional view of the pull-up transistors PU1 and PU2 of the first data storage cell 12 are illustrated, and the pull-up transistors PU1 and PU2 are P-type Fin FETs. In this embodiment, the cell height H1 is the same as 4 times the contacted poly pitch (CPP), i.e., 4 times the gate pitch for the gate structures 130a through 130j. The N-type well region NW1 is formed over the substrate 101. The N-type well region NW1 is formed by Si with Phosphorus doping. The fin 107a is formed in the N-type well region NW1, and includes Si or SiGe.

Figure 8B:
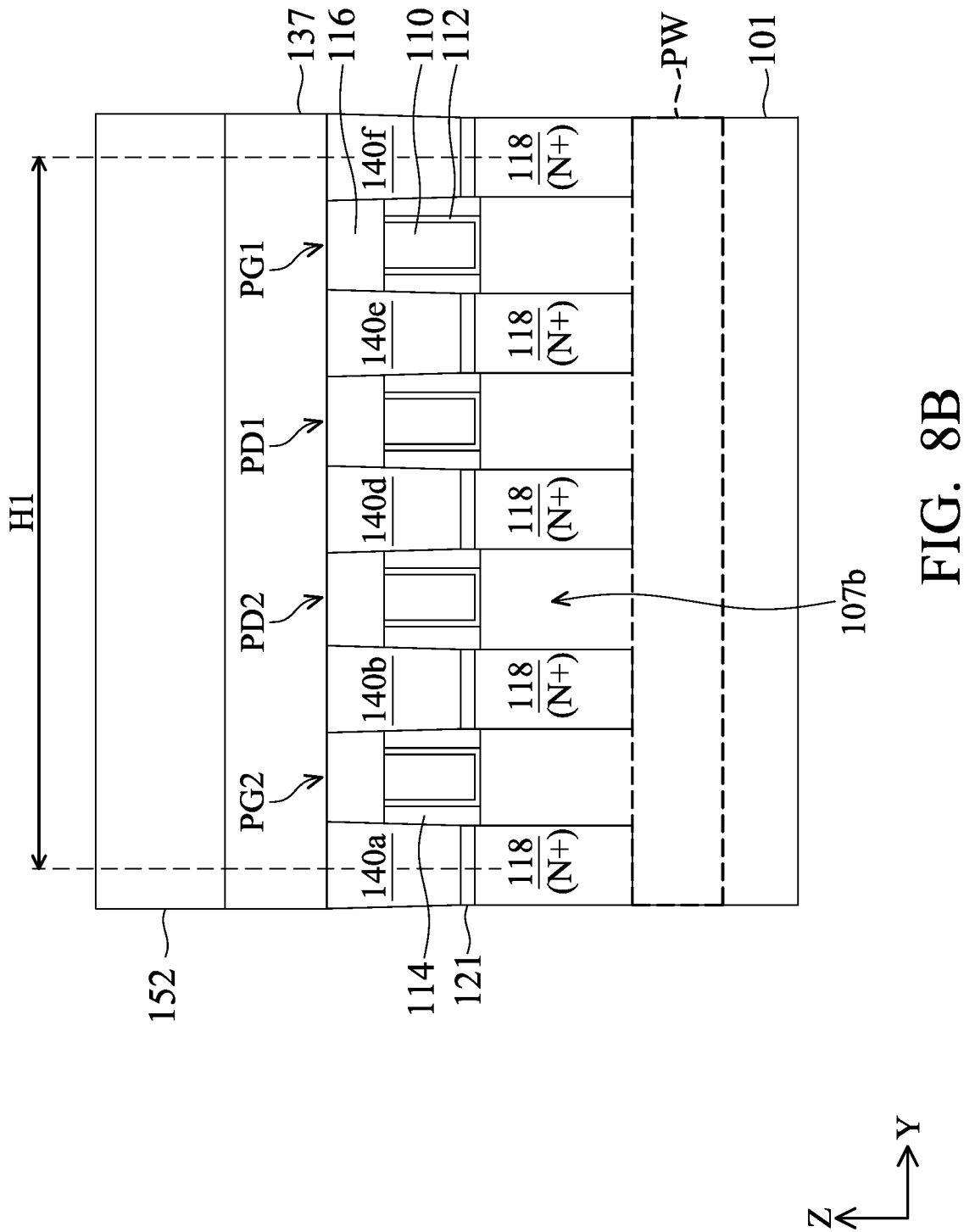
FIG. 8B shows a cross sectional view of the semiconductor device along a line E-EE in FIG. 7, in accordance with some embodiments of the disclosure.

FIG. 8B shows a cross sectional view of the semiconductor device along a line E-EE in FIG. 7, in accordance with some embodiments of the disclosure. In FIG. 8B, the cross sectional view of the pull-down transistors PD1 and PD2 and the pass-gate transistors PG1 and PG2 of the first data storage cell 12 are illustrated, and the pull-down transistors PD1 and PD2 and the pass-gate transistors PG1 and PG2 are N-type transistors. The P-type well region PW is formed over the substrate 101. The P-type well region PW is formed by Si with Boron doping. The fin 107b is formed in the P-type well region PW, and includes Si.

Figure 8C:
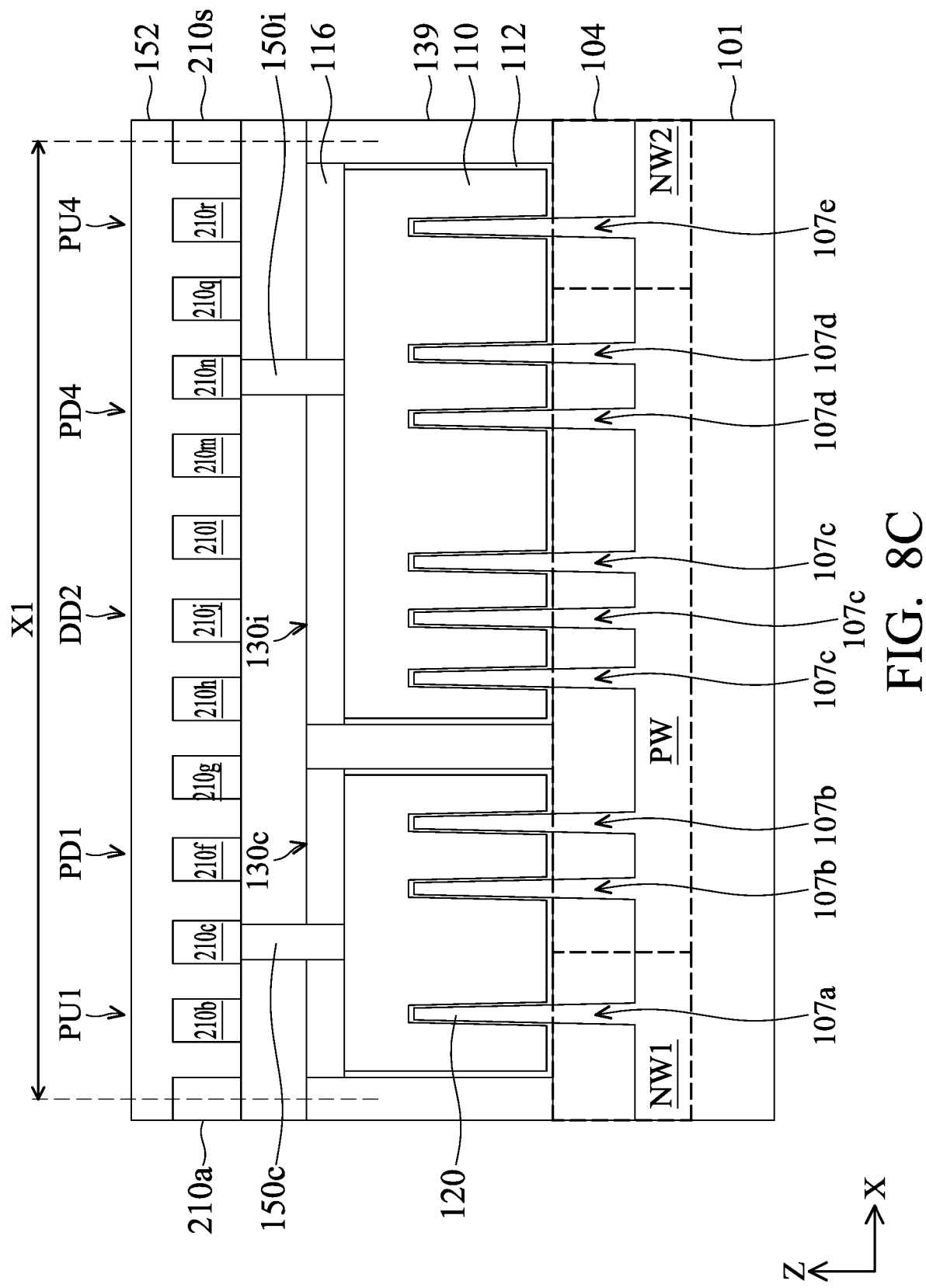
FIG. 8C shows a cross sectional view of the semiconductor device along a line F-FF in FIG. 7, in accordance with some embodiments of the disclosure.

FIG. 8C shows a cross sectional view of the semiconductor device along a line F-FF in FIG. 7, in accordance with some embodiments of the disclosure. As described above, the memory cell has a cell width (or cell pitch) W1 measurable in the X direction. In FIG. 8C, the cross sectional view of the pull-up transistors PU1 and the pull-down transistors PD1 of the first data storage cell 12, the data transistor DD2 of the match cell 16, and the pull-up transistors PU4 and the pull-down transistors PD4 of the second data storage cell 14 are illustrated.

Figure 9A:
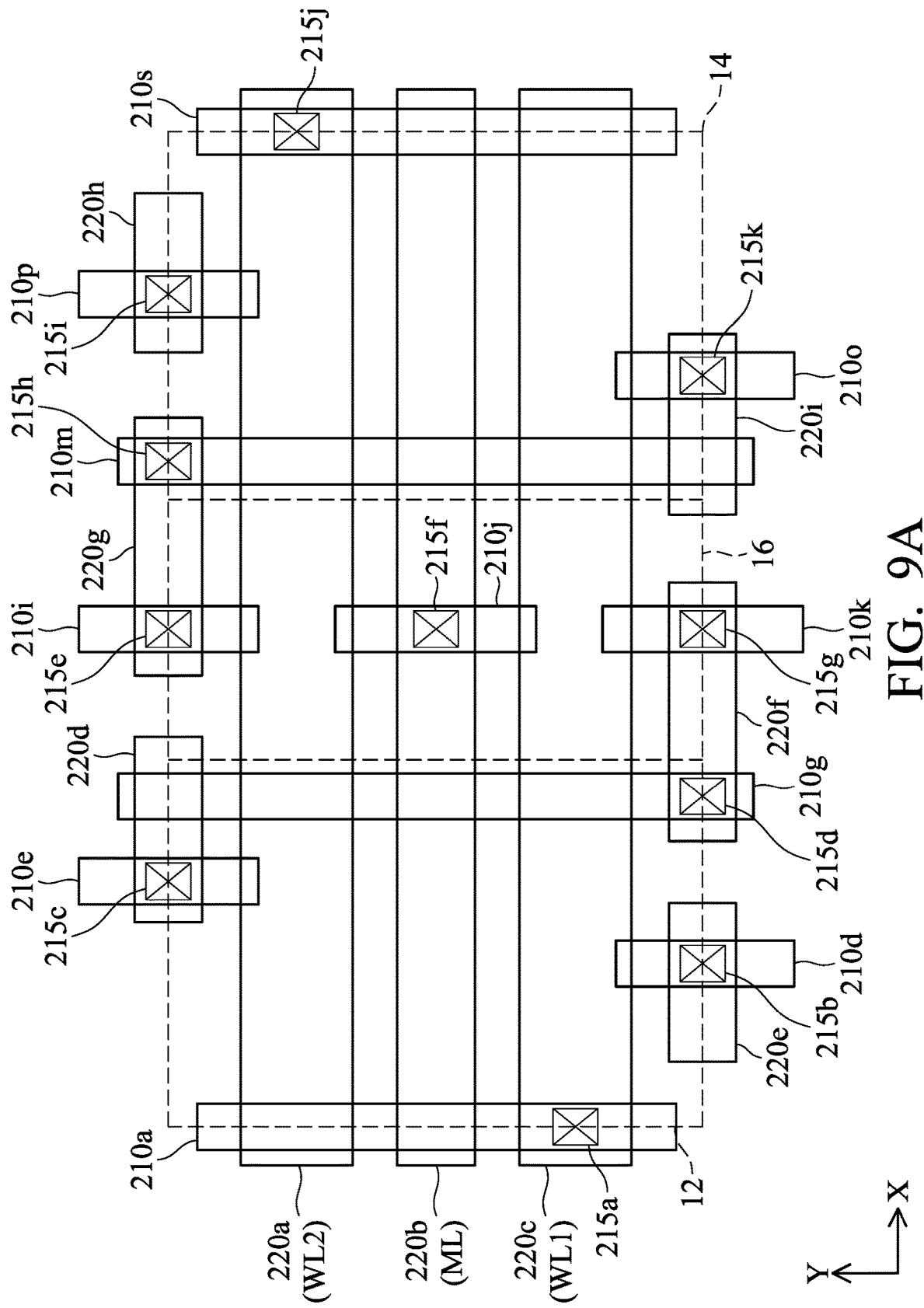
FIG. 9A shows a top view of the memory cell, with all the depictions regarding components between the first and second metal layers, in accordance with some embodiments of the disclosure.

FIG. 9A shows a top view of the memory cell, with all the depictions regarding components between the first and second metal layers, in accordance with some embodiments of the disclosure. The metal lines 220a through 220i are formed in the second metal layer and extend in the X direction.

The metal line 220c is electrically connected to the metal line 210a through the via 215a, so as to electrically connect the gate structures 130a and 130d for the pass-gate transistors PG2 and PG1. The metal line 220c functions as the first word line WL1 for the first data storage cell 12. The metal line 220a is electrically connected to the metal line 210s through the via 215j, so as to electrically connect the gate structures 130g and 130j for the pass-gate transistors PG3 and PG4. The metal line 220a functions as the second word line WL2 for the second data storage cell 14. The metal line 220b is electrically connected to the metal line 210j through the via 215f, so as to electrically connect the source/drain contact 140i for the data transistors DD1 and DD2. The metal line 220b functions as the match line ML for the match cell 16.

As described in the memory cell 10A of FIG. 1B, the first word line WL1, the match line ML and the second word line WL2 extend in the X-direction and pass through the first data storage cell 12, the match cell 16, and the second data storage cell 14 in FIG. 9A. Furthermore, the match line ML is surrounded by the first word line WL1 and the second word line WL2. In some embodiments, the width (in the Y-direction) of the first word line WL1 and the second word line WL2 is greater than the width (in the Y-direction) of the match line ML.

In FIG. 9A, the metal line 220f is electrically connected to the metal line 210g through the via 215d and the metal line 210k through the via 215k. The metal line 220f functions as a local connection line of the VSS line for the first data storage cell 12 and the match cell 16. The metal line 220g is electrically connected to the metal line 210m through the via 215h and the metal line 210i through the via 215e. The metal line 220g functions as a local connection line of the VSS line for the second data storage cell 14 and the match cell 16.

The metal line 220d is electrically connected to the metal line 210e through the via 215c. The metal line 220d functions as a landing pad of the first complementary bit line BLB1 for the first data storage cell 12. The metal line 220e is electrically connected to the metal line 210d through the via 215b. The metal line 220e functions as a landing pad of the first bit line BL1 for the first data storage cell 12. The metal line 220i is electrically connected to the metal line 210o through the via 215k. The metal line 220i functions as a landing pad of the second complementary bit line BLB2 for the second data storage cell 14. The metal line 220h is electrically connected to the metal line 210p through the via 215i. The metal line 220e functions as a landing pad of the second bit line BL2 for the second data storage cell 14.

Figure 9B:
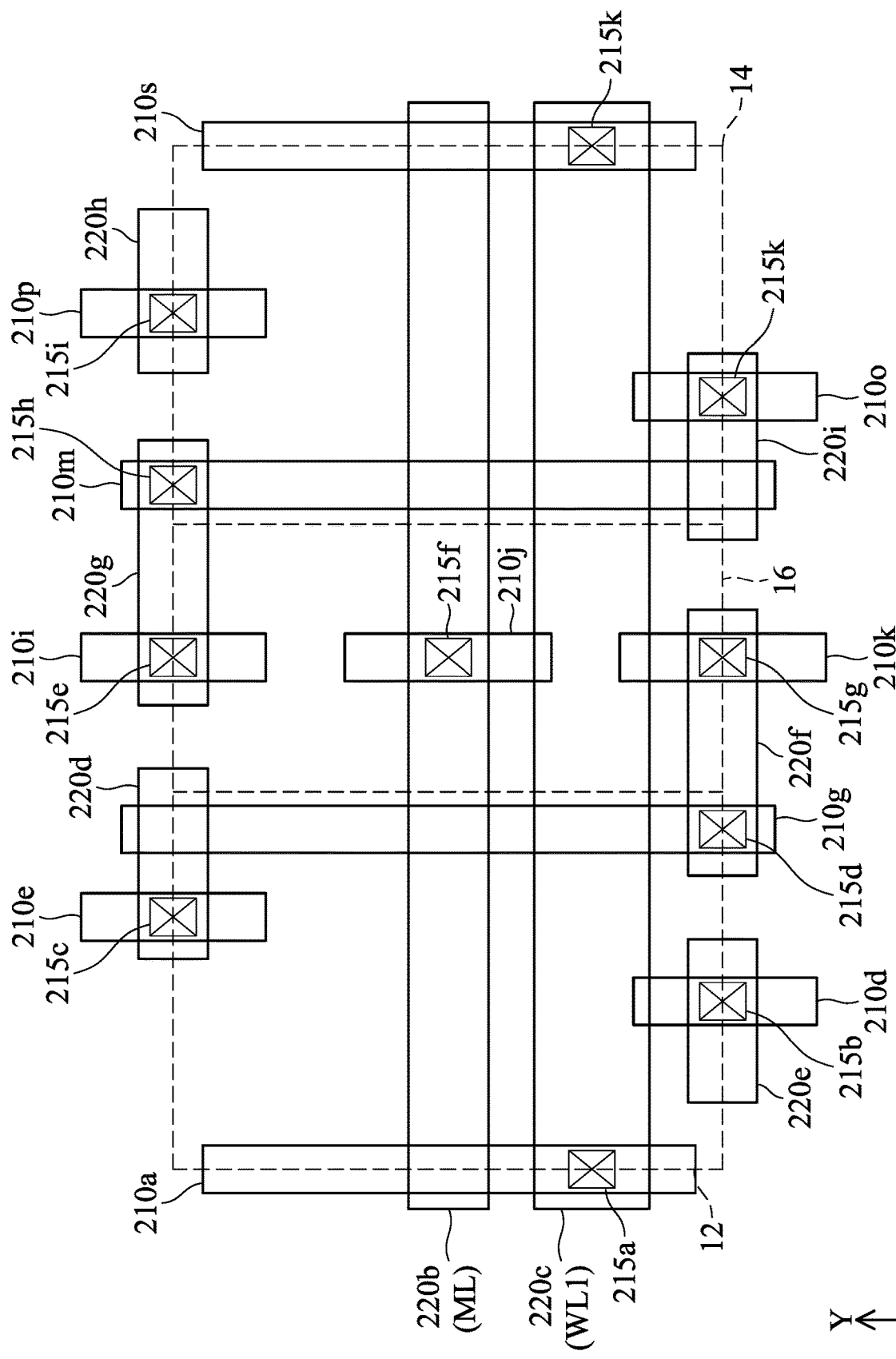
FIG. 9B shows a top view of the memory cell, with all the depictions regarding components between the first and second metal layers, in accordance with some embodiments of the disclosure.

FIG. 9B shows a top view of the memory cell, with all the depictions regarding components between the first and second metal layers, in accordance with some embodiments of the disclosure. The configuration of the metal lines in FIG. 9B is similar to the configuration of the metal lines in FIG. 9A, and the difference between the metal lines of FIG. 9A and the metal lines of FIG. 9B is that the metal line 220a is removed. In FIG. 9B, no second word line WL2 is provided to the second data storage cell 14 of the memory cell.

The metal line 220c is electrically connected to the metal line 210a through the via 215a, so as to electrically connect the gate structures 130a and 130d for the pass-gate transistors PG2 and PG1. Furthermore, the metal line 220c is further electrically connected to the metal line 210s through the via 215k, so as to electrically connect the gate structures 130g and 130j for the pass-gate transistors PG3 and PG4. Therefore, the metal line 220c functions as the first word line WL1 for the first data storage cell 12 and the second data storage cell 14. The metal line 220b is electrically connected to the metal line 210j through the via 215f, so as to electrically connect the source/drain contact 140i for the data transistors DD1 and DD2. The metal line 220b functions as the match line ML for the match cell 16.

As described in the memory cell 10B of FIG. 2B, the first word line WL1 and the match line ML extend in the X-direction and pass through the first data storage cell 12, the match cell 16, and the second data storage cell 14 in FIG. 9B. Furthermore, the match line ML is adjacent to the first word line WL1. In some embodiments, the width (in the Y-direction) of the first word line WL1 is greater than the width (in the Y-direction) of the match line ML.

Figure 9C:
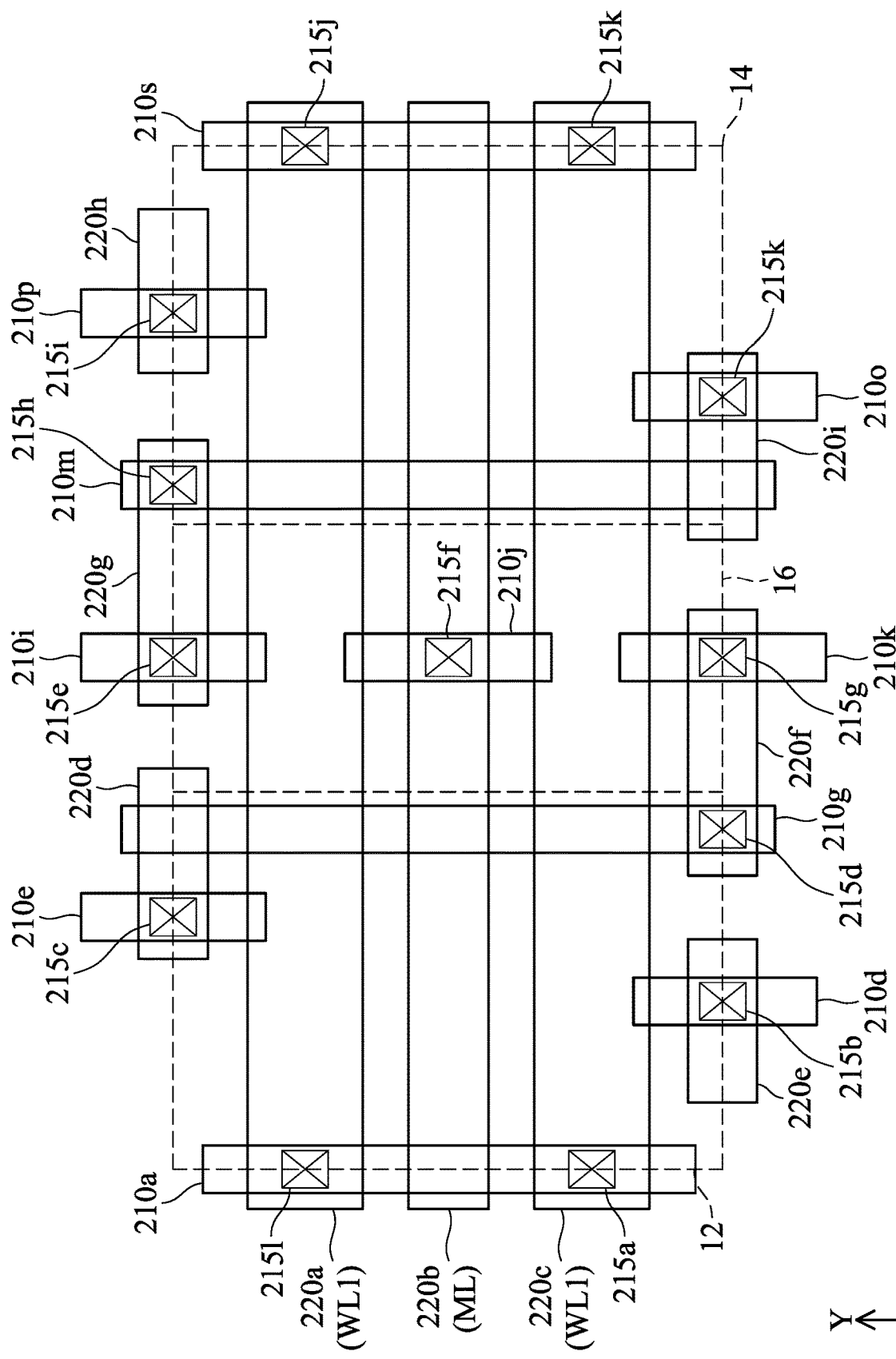
FIG. 9C shows a top view of the memory cell, with all the depictions regarding components between the first and second metal layers, in accordance with some embodiments of the disclosure.

FIG. 9C shows a top view of the memory cell, with all the depictions regarding components between the first and second metal layers, in accordance with some embodiments of the disclosure. The configuration of the metal lines in FIG. 9C is similar to the configuration of the metal lines in FIG. 9A, and the difference between the metal lines of FIG. 9A and the metal lines of FIG. 9B is that the metal line 220a is electrically connected to the metal line 220c. In FIG. 9C, no second word line WL2 is provided to the second data storage cell 14 of the memory cell.

The metal lines 220a and 220c are electrically connected to the metal line 210a through the gates 215l and 215a, respectively, so as to electrically connect the gate structures 130a and 130d for the pass-gate transistors PG2 and PG1. Furthermore, the metal lines 220a and 220c are further electrically connected to the metal line 210s through the gates 215j and 215k, respectively, so as to electrically connect the gate structures 130g and 130j for the pass-gate transistors PG3 and PG4. In other words, the metal lines 220a and 220c are electrically connected together by the metal lines 210a and 210s. Therefore, the metal lines 220a and 220c function as the first word line WL1 for the first data storage cell 12 and the second data storage cell 14. The metal line 220b is electrically connected to the metal line 210j through the via 215f, so as to electrically connect the source/drain contact 140i for the data transistors DD1 and DD2. The metal line 220b functions as the match line ML for the match cell 16.

As described in the memory cell 10B of FIG. 2C, the first word line WL1, the match line ML and the second word line WL2 extend in the X-direction and pass through the first data storage cell 12, the match cell 16, and the second data storage cell 14 in FIG. 9C. Furthermore, the match line ML is arranged between the two first word lines WL1. In some embodiments, the width (in the Y-direction) of the two first word lines WL1 is greater than the width (in the Y-direction) of the match line ML.

Figure 10A:
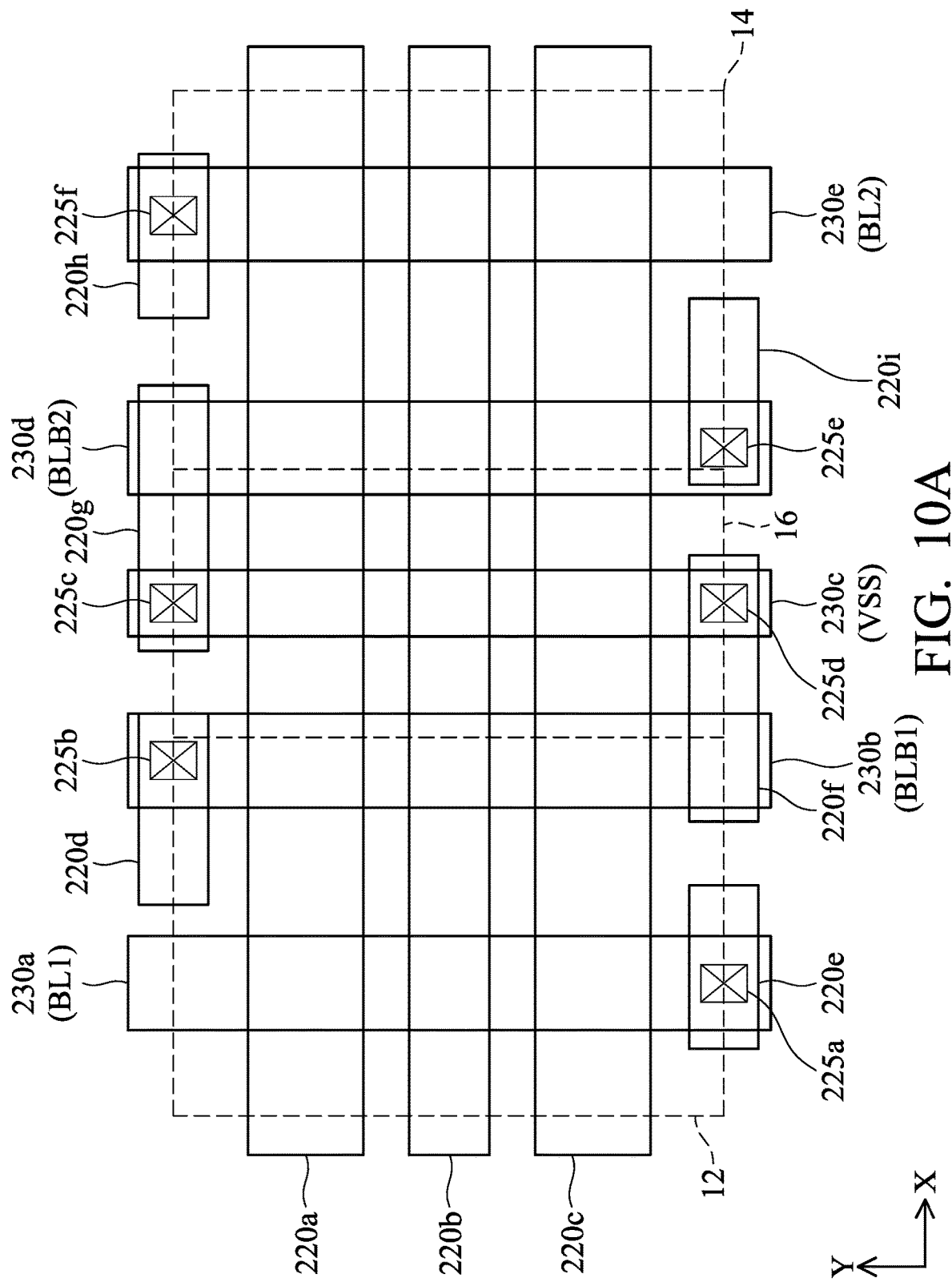
FIG. 10A shows a top view of the memory cell, with all the depictions regarding components between the second and third metal layers, in accordance with some embodiments of the disclosure.

FIG. 10A shows a top view of the memory cell, with all the depictions regarding components between the second and third metal layers, in accordance with some embodiments of the disclosure. The metal lines 230a through 230e are formed in the third metal layer and extend in the Y-direction.

The metal line 230a is electrically connected to the metal line 220e through the via 225a, so as to electrically connect the source/drain contact 140f for the pass-gate transistor PG1. The metal line 230a functions as the first bit line BL1 for the first data storage cell 12. The metal line 230b is electrically connected to the metal line 220d through the via 225b, so as to electrically connect the source/drain contact 140a for the pass-gate transistor PG2. The metal line 230b functions as the first complementary bit line BLB1 for the first data storage cell 12. The metal line 230e is electrically connected to the metal line 220h through the via 225f, so as to electrically connect the source/drain contact 140l for the pass-gate transistor PG3. The metal line 230e functions as the second bit line BL2 for the second data storage cell 14. The metal line 230d is electrically connected to the metal line 220i through the via 225e, so as to electrically connect the source/drain contact 140q for the pass-gate transistor PG4. The metal line 230d functions as the second complementary bit line BLB2 for the second data storage cell 14. The metal line 230c is electrically connected to the metal line 220f through the via 225d and the metal line 220g through the via 225c, so as to electrically connect the source/drain contact 140k for the search transistor SD2 and the source/drain contact 140g for the search transistor SD1. The metal line 230c functions as the VSS line for the memory cell.

In FIG. 10A, the first bit line BL1, the first complementary bit line BLB1, the VSS line, the second complementary bit line BLB1, and the second bit line BL2 extend in the Y-direction and pass through the memory cell. Furthermore, the VSS line is surrounded by the first complementary bit line BLB1 and the second complementary bit line BLB2. The first complementary bit line BLB1 is disposed between the VSS line and the first bit line BL1, and the second complementary bit line BLB2 is disposed between the VSS line and the second bit line BL2. In some embodiments, the width (in the X-direction) of the first bit line BL1, the first complementary bit line BLB1, the second bit line BL2, the second complementary bit line BLB2 is greater than the width (in the X-direction) of the VSS line.

Compared with traditional TCAM cell that has the bit line BL and the complementary bit line BLB formed in the lowest metal layer, the bit lines BL1 and BL2 and the complementary bit line BLB1 and BLB2 are formed in the higher metal layer (e.g., the third metal layer) of memory cell, thereby increasing the width of the bit lines BL1 and BL2 and the complementary bit line BLB1 and BLB2 so as to avoid high resistance issue induced by IR drop and improve routing density in the lowest metal layer. Therefore, the complexity of back end of line (BEOL) metal routing is decreased. Compared with traditional TCAM cell, the memory cell has lower bit-line capacitance. For example, the capacitance reduction can up to 25%~50%.

In some embodiments, the bit lines BL1 and BL2 and the complementary bit line BLB1 and BLB2 are formed in different metal layers. For example, the bit lines BL1 and BL2 are formed in the first metal layer, and the complementary bit line BLB1 and BLB2 are formed in the third metal layer. Conversely, the bit lines BL1 and BL2 are formed in the third metal layer, and the complementary bit line BLB1 and BLB2 are formed in the first metal layer.

Figure 10B:
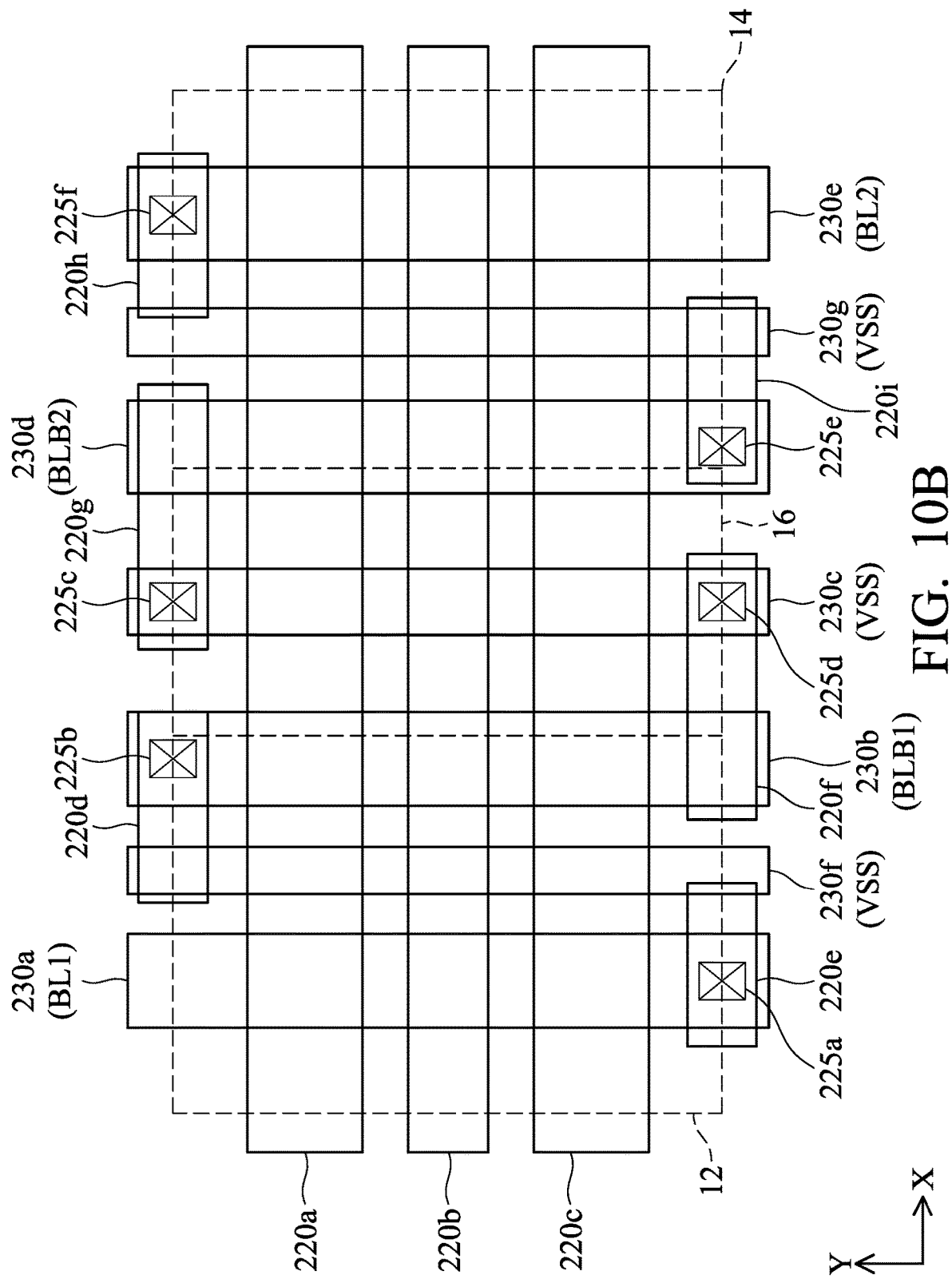
FIG. 10B shows a top view of the memory cell, with all the depictions regarding components between the second and third metal layers, in accordance with some embodiments of the disclosure.

FIG. 10B shows a top view of the memory cell, with all the depictions regarding components between the second and third metal layers, in accordance with some embodiments of the disclosure. The configuration of the metal lines in FIG. 10B is similar to the configuration of the metal lines in FIG. 10A, and the difference between the metal lines of FIG. 10A and the metal lines of FIG. 10B is that the memory cell of 10B further includes the metal lines 230f and 230g.

In FIG. 10B, the first complementary bit line BLB1 is surrounded by the metal lines 230f and 230c, and the second complementary bit line BLB2 is surrounded by the metal lines 230g and 230c. The metal line 230f is disposed between the first bit line BL1 and the first complementary bit line BLB1, and the metal line 230g is disposed between the second bit line BL2 and the second complementary bit line BLB2. The metal lines 230f and 230g function as the VSS lines for the memory cell. Therefore, the VSS lines are used to provide signal isolation to avoid interference between the first bit line BL1 and the first complementary bit line BLB1 and between the second bit line BL2 and the second complementary bit line BLB2.

Figure 10C:
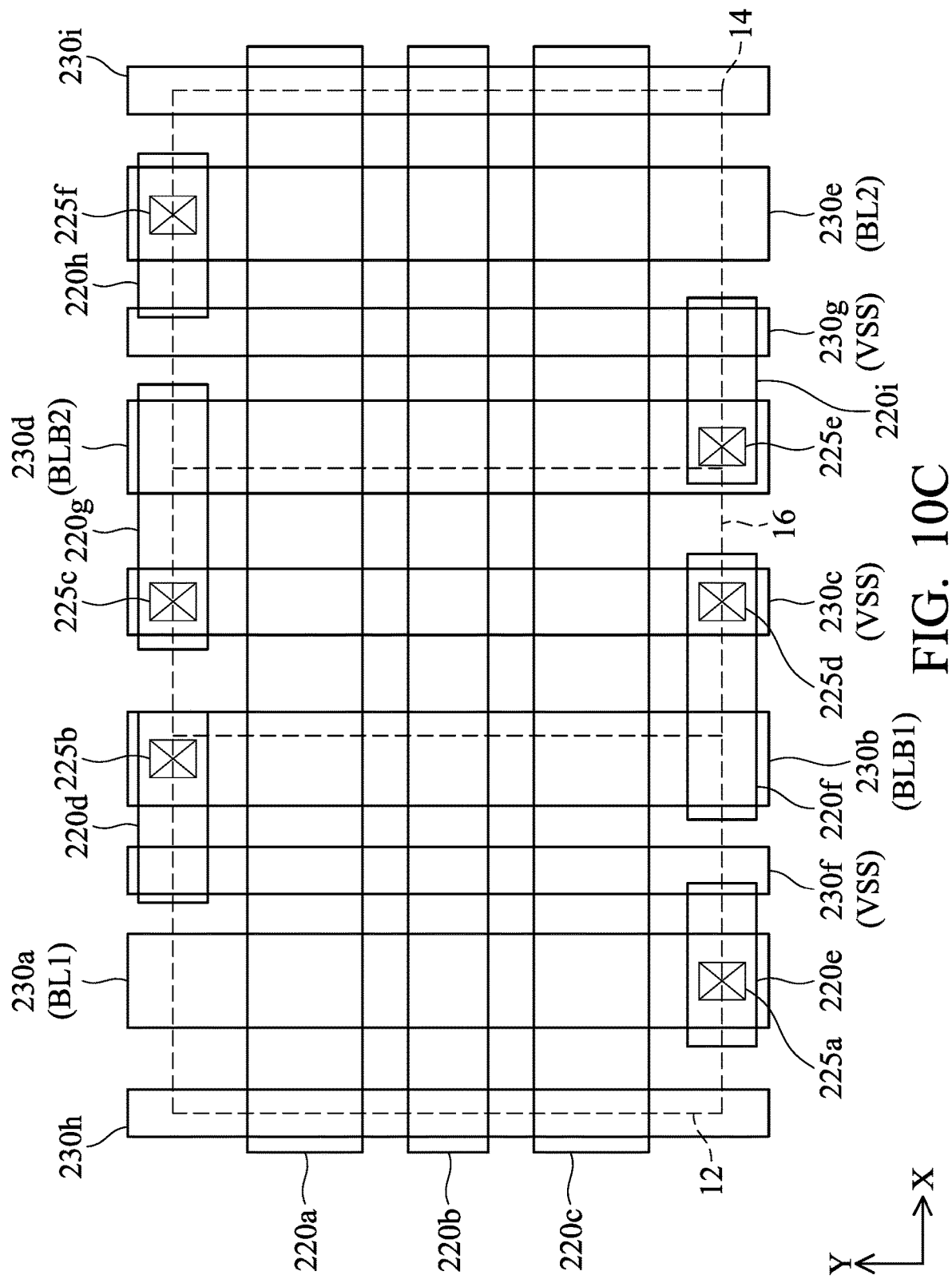
FIG. 10C shows a top view of the memory cell, with all the depictions regarding components between the second and third metal layers, in accordance with some embodiments of the disclosure.

FIG. 10C shows a top view of the memory cell, with all the depictions regarding components between the second and third metal layers, in accordance with some embodiments of the disclosure. The configuration of the metal lines in FIG. 10C is similar to the configuration of the metal lines in FIG. 10B, and the difference between the metal lines of FIG. 10B and the metal lines of FIG. 10C is that the memory cell of 10C further includes the metal lines 230h and 230i.

In FIG. 10C, the first bit line BL1 is surrounded by the metal lines 230h and 230f, and the second bit line BL2 is surrounded by the metal lines 230i and 230g. The metal lines 230h and 230i are disposed over the boundary of the memory cell. The metal lines 230h and 230i function as the VSS lines for the memory cell. Therefore, the VSS lines are used to provide signal isolation to avoid interference between the first bit line BL1 and the first complementary bit line BLB1 and between the second bit line BL2 and the second complementary bit line BLB2.

Figure 11:
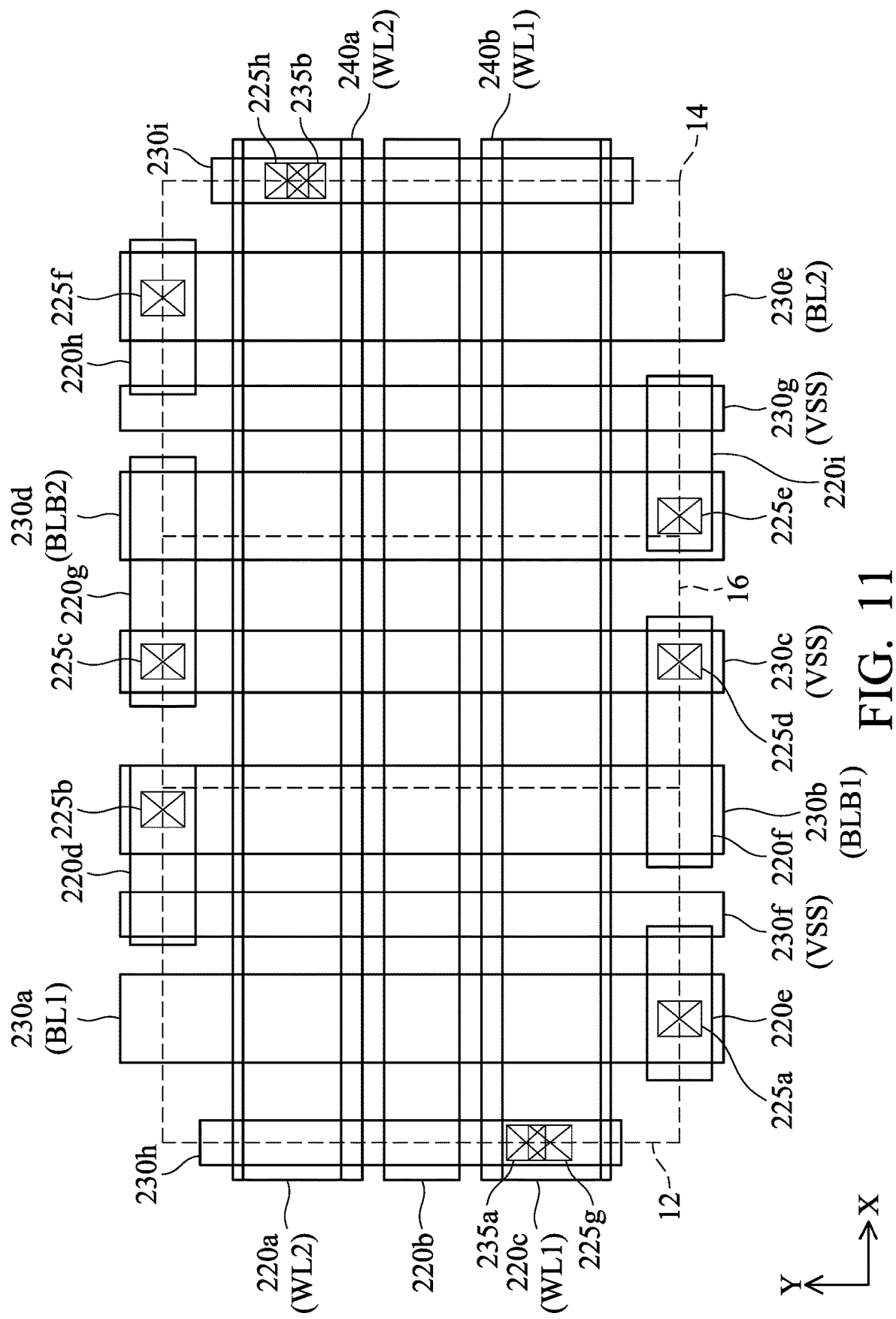
FIG. 11 shows a top view of the memory cell, with all the depictions regarding components in and over the second metal layer, in accordance with some embodiments of the disclosure.

FIG. 11 shows a top view of the memory cell, with all the depictions regarding components in and over the second metal layer, in accordance with some embodiments of the disclosure. The metal lines 240a and 240b are formed in the third metal layer and extend in the X-direction.

The metal line 240a is electrically connected to the metal line 230i through the via 235b, and the metal line 230i is further electrically connected to the metal line 220a through the via 225h. The metal lines 240a and 220a function as the second word line WL2 for the second data storage cell 14. The metal line 240b is electrically connected to the metal line 230h through the via 235a, and the metal line 230h is further electrically connected to the metal line 220c through the via 225g. The metal lines 240b and 220c function as the first word line WL1 for the first data storage cell 12. In FIG. 11, for the memory cell, the double word lines WL1 and WL2 (e.g., the word lines in the second and fourth metal layers) are used so as to decrease the resistance of the word lines WL1 and WL2.

Embodiments of memory cells are provided. The memory cell is a TCAM cell and includes two data storage cells and a match cell. In some embodiments, the two data storage cells are accessed by individual bit line pairs and individual word lines. In some embodiments, the two data storage cells are accessed by individual bit line pairs and the same word line. In layout, the two data storage cells are disposed on the opposite sides of the match cell. Furthermore, the two data storage cells and the match cell have the same cell height. Each data storage cell may be a SRAM cell including two pull-up transistors shared by a first active region and two pull-down transistors and two pass-gate transistors shared by a second active region. By arranging the individual bit line pairs in the higher metal layer, the memory cell can provide high density (e.g., less active region layer and less metal lines in each layer) and high speed (e.g., lower RC delay for both bit line pairs and word lines) for SRAM application.

In some embodiments, a memory cell is provided. The memory cell includes a first data storage cell over a substrate, a second data storage cell over the substrate and a match cell over the substrate. The first data storage cell includes a first pull-down transistor, a first pull-up transistor and a first pass-gate transistor having a source electrically connected to a first bit line. The second data storage cell includes a second pull-down transistor, a second pull-up transistor, and a second pass-gate transistor having a source electrically connected to a second bit line. The match cell includes a first data transistor and a second data transistor. The first data transistor has a gate electrically connected to drains of the first pull-down transistor, the first pull-up transistor and the first pass-gate transistor. The second data transistor has a gate electrically connected to drains of the second pull-down transistor, the second pull-up transistor and the second pass-gate transistor. The first data storage cell, the match cell and the second data storage cell have the same cell height in a first direction, and the match cell is disposed between the first and second data storage cells.

In some embodiments, a memory cell is provided. The memory cell includes a first data storage cell, a second data storage cell and a match cell. The first data storage cell includes a first pull-down transistor, a first pull-up transistor and a first pass-gate transistor, and the first pass-gate transistor has a source electrically connected to a first bit line. The first pull-down transistor and the first pass-gate transistor share a first active region extending in a first direction. The second data storage cell includes a second pull-down transistor, a second pull-up transistor and a second pass-gate transistor, and the second pass-gate transistor has a source electrically connected to a second bit line. The second pull-down transistor and the second pass-gate transistor share a second active region extending in the first direction. The match cell includes a first data transistor and a first search transistor cascade-coupled between a match line and the ground, and a second data transistor and a second search transistor cascade-coupled between the match line and the ground. The first and second data transistors and the first and second search transistors share a third active region extending in the first direction. The third active region is disposed between the first and second active regions, and the width of the third active region is greater than the width of the first and second active regions in a second direction, and the second direction is perpendicular to the first direction.

In some embodiments, a memory cell is provided. The memory cell includes a first data storage cell, a second data storage cell and a match cell over a substrate. The first data storage cell includes a first pull-down transistor, a first pull-up transistor and a first pass-gate transistor having a source electrically connected to a first bit line. The second data storage cell includes a second pull-down transistor, a second pull-up transistor and a second pass-gate transistor having a source electrically connected to a second bit line. The match cell includes a first data transistor and a first search transistor cascade-coupled between a match line and the ground, and a second data transistor and a second search transistor cascade-coupled between the match line and the ground. A gate of the first data transistor is electrically connected to drains of the first pull-down transistor, the first pull-up transistor and the first pass-gate transistor, and a gate of the second data transistor is electrically connected to drains of the second pull-down transistor, the second pull-up transistor and the second pass-gate transistor. A gate of the first search transistor is electrically connected to a search line, and a gate of the second search transistor is electrically connected to a complementary search line. The first data storage cell, the match cell and the second data storage cell have the same cell height in a first direction. The search line and the complementary search line are formed in a first metal layer and extend in the first direction, and the first and second bit lines are formed in a second metal layer over the first metal layer and extend in the first direction.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a first data storage cell over a substrate, comprising:
      a first pull-down transistor;
      a first pull-up transistor; and
      a first pass-gate transistor having a source electrically connected to a first bit line;
   a second data storage cell over the substrate, comprising:
      a second pull-down transistor;
      a second pull-up transistor; and
      a second pass-gate transistor having a source electrically connected to a second bit line; and
   a match cell over the substrate, comprising:
      a first data transistor having a gate electrically connected to drains of the first pull-down transistor, the first pull-up transistor and the first pass-gate transistor; and
      a second data transistor having a gate electrically connected to drains of the second pull-down transistor, the second pull-up transistor and the second pass-gate transistor,
   wherein the first data storage cell, the match cell and the second data storage cell have the same cell height in a first direction, and the match cell is disposed between the first and second data storage cells.

2. The memory cell as claimed in claim 1, wherein the match cell further comprises:
   a first search transistor having a gate electrically connected to a search line; and
   a second search transistor having a gate electrically connected to a complementary search line,
   wherein the first search transistor and the first data transistor are cascade-coupled between a match line and a ground, and the second search transistor and the second data transistor are cascade-coupled between the match line and the ground.

3. The memory cell as claimed in claim 2, wherein the first and second data transistors and the first and second search transistors share the same active region.

4. The memory cell as claimed in claim 2, wherein the first data storage cell further comprises:
   a third pull-down transistor having a gate electrically connected to the gate of the first data transistor; and
   a third pull-up transistor having a gate electrically connected to the gate of the first data transistor,
   wherein the third pull-down transistor, the third pull-up transistor and the first data transistor share the same gate structure,
   wherein the second data storage cell further comprises:
   a fourth pull-down transistor having a gate electrically connected to the gate of the second data transistor; and
   a fourth pull-up transistor having a gate electrically connected to the gate of the second data transistor,
   wherein the fourth pull-down transistor, the fourth pull-up transistor and the second data transistor share the same gate structure.

5. The memory cell as claimed in claim 2, wherein the search line and the complementary search line are formed in a lowest metal layer and extend in the first direction.

6. The memory cell as claimed in claim 1, wherein a gate of the first pass-gate transistor is electrically connected to a first word line, and a gate of the second pass-gate transistor is electrically connected to a second word line that is different from the first word line.

7. The memory cell as claimed in claim 6, wherein the first and second word lines are formed in a first metal layer and extend in a second direction that is perpendicular to the first direction, and the first and second bit lines are formed in a second metal layer over the first metal layer and extend in the first direction.

8. The memory cell as claimed in claim 1, wherein gates of the first and second pass-gate transistors are electrically connected to a word line, wherein the word line is formed in a first metal layer and extend in a second direction that is perpendicular to the first direction, and the first and second bit lines are formed in a second metal layer over the first metal layer and extend in the first direction.

9. The memory cell as claimed in claim 1, wherein the first bit line, the second bit line and at least one VSS line are formed in a metal layer over a lowest metal layer, and extend in the first direction, wherein the first bit line is separated from the second bit line by the VSS line.

10. A memory cell, comprising:
    a first data storage cell, comprising:

a first pull-down transistor;
a first pull-up transistor; and
a first pass-gate transistor having a source electrically connected to a first bit line, wherein the first pull-down transistor and the first pass-gate transistor share a first active region extending in a first direction;
a second data storage cell, comprising:
a second pull-down transistor;
a second pull-up transistor; and
a second pass-gate transistor having a source electrically connected to a second bit line, wherein the second pull-down transistor and the second pass-gate transistor share a second active region extending in the first direction; and
a match cell, comprising:
a first data transistor and a first search transistor cascade-coupled between a match line and a ground; and
a second data transistor and a second search transistor cascade-coupled between the match line and the ground,
wherein the first and second data transistors and the first and second search transistors share a third active region extending in the first direction,
wherein the third active region is disposed between the first and second active regions, and a width of the third active region is greater than a width of the first and second active regions in a second direction that is perpendicular to the first direction.

11. The memory cell as claimed in claim 10, wherein the first active region is disposed between a fourth active region of the first pull-up transistor and the third active region, and the second active region is disposed between a fifth active region of the second pull-up transistor and the third active region, and the width of the first and second active regions is greater than a width of the third and fourth active regions in the second direction.

12. The memory cell as claimed in claim 10, wherein the first pull-up transistor, the first pull-down transistor and the first data transistor share the same gate structure, and the second pull-up transistor, the second pull-down transistor and the second data transistor share the same gate structure.

13. The memory cell as claimed in claim 10, wherein a gate of the first search transistor is electrically connected to a search line, and a gate of the first search transistor is electrically connected to a complementary search line, wherein the search line and the complementary search line are formed in a lowest metal layer and extend in the first direction.

14. The memory cell as claimed in claim 10, wherein a gate of the first pass-gate transistor is electrically connected to a first word line, and a gate of the second pass-gate transistor is electrically connected to a second word line that is different from the first word line.

15. The memory cell as claimed in claim 14, wherein the first and second word lines are formed in a first metal layer and extend in the second direction, and the first and second bit lines are formed in a second metal layer over the first metal layer and extend in the first direction.

16. The memory cell as claimed in claim 10, wherein gates of the first and second pass-gate transistors are electrically connected to a word line, wherein the word line is formed in a first metal layer and extend in the second direction, and the first and second bit lines are formed in a second metal layer over the first metal layer and extend in the second direction.

17. The memory cell as claimed in claim 10, wherein the first bit line, the second bit line and at least one VSS line are formed in a metal layer over a lowest metal layer, and extend in the first direction, wherein the first bit line is separated from the second bit line by the VSS line.

18. A memory cell, comprising:
a first data storage cell over a substrate, comprising:
a first pull-down transistor;
a first pull-up transistor; and
a first pass-gate transistor having a source electrically connected to a first bit line;
a second data storage cell over the substrate, comprising:
a second pull-down transistor;
a second pull-up transistor; and
a second pass-gate transistor having a source electrically connected to a second bit line; and
a match cell over the substrate, comprising:
a first data transistor and a first search transistor cascade-coupled between a match line and a ground; and
a second data transistor and a second search transistor cascade-coupled between the match line and the ground,
wherein a gate of the first data transistor is electrically connected to drains of the first pull-down transistor, the first pull-up transistor and the first pass-gate transistor, and a gate of the second data transistor is electrically connected to drains of the second pull-down transistor, the second pull-up transistor and the second pass-gate transistor,
wherein a gate of the first search transistor is electrically connected to a search line, and a gate of the second search transistor is electrically connected to a complementary search line,
wherein the first data storage cell, the match cell and the second data storage cell have the same cell height in a first direction,
wherein the search line and the complementary search line are formed in a first metal layer and extend in the first direction, and the first and second bit lines are formed in a second metal layer over the first metal layer and extend in the first direction.

19. The memory cell as claimed in claim 18, wherein a gate of the first pass-gate transistor is electrically connected to a first word line, and a gate of the second pass-gate transistor is electrically connected to a second word line that is different from the first word line, wherein the first and second word lines are formed in a third metal layer and extend in a second direction that is perpendicular to the first direction, and the third metal layer is formed between the first metal layer and the second metal layer.

20. The memory cell as claimed in claim 18, wherein gates of the first and second pass-gate transistors are electrically connected to a word line, wherein the word line is formed in a third metal layer and extend in a second direction that is perpendicular to the first direction, and the third metal layer is formed between the first metal layer and the second metal layer.

* * * * *